(12) United States Patent
Boutillon et al.

(10) Patent No.: US 11,476,870 B2
(45) Date of Patent: Oct. 18, 2022

(54) VARIABLE NODE PROCESSING METHODS AND DEVICES FOR MESSAGE-PASSING DECODING OF NON-BINARY CODES

(71) Applicant: UNIVERSITE DE BRETAGNE SUD, Lorient (FR)

(72) Inventors: Emmanuel Boutillon, Lorient (FR); Cédric Marchand, Queven (FR); Hassan Harb, Tibnin (LB)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 17/257,191

(22) PCT Filed: Jul. 4, 2019

(86) PCT No.: PCT/EP2019/068040
§ 371 (c)(1),
(2) Date: Dec. 30, 2020

(87) PCT Pub. No.: WO2020/008005
PCT Pub. Date: Jan. 9, 2020

(65) Prior Publication Data
US 2021/0167799 A1    Jun. 3, 2021

(30) Foreign Application Priority Data
Jul. 5, 2018  (EP) .................................... 18305888

(51) Int. Cl.
*H03M 13/11*    (2006.01)
(52) U.S. Cl.
CPC .... *H03M 13/1111* (2013.01); *H03M 13/1171* (2013.01)
(58) Field of Classification Search
CPC .......... H03M 13/1111; H03M 13/1171; H03M 13/1102; H03M 13/6591; H03M 13/114
See application file for complete search history.

(56) References Cited

U.S. PATENT DOCUMENTS

| 8,918,704 B2 * | 12/2014 | Declercq | H03M 13/112 |
| | | | 714/778 |
| 2013/0019141 A1 * | 1/2013 | Wang | H03M 13/6583 |
| | | | 714/763 |
| 2013/0305114 A1 * | 11/2013 | Olcay | H03M 13/1128 |
| | | | 714/755 |

OTHER PUBLICATIONS

Leixin Zhou, J. Sha and Z. Wang, "Efficient EMS decoding for non-binary LDPC codes," 2012 International SoC Design Conference (ISOCC), Jeju, Korea (South), 2012, pp. 339-342.*

(Continued)

*Primary Examiner* — Steve N Nguyen
(74) *Attorney, Agent, or Firm* — Meagher Emanuel Laks Goldberg & Liao, LLO

(57) ABSTRACT

Embodiments of the invention provide a variable node processing unit for a non-binary error correcting code decoder, the variable node processing unit being configured to receive one check node message and intrinsic reliability metrics, and to generate one variable node message from auxiliary components derived from said one check node message and intrinsic reliability metrics, the intrinsic reliability metrics being derived from a received signal, an auxiliary component comprising an auxiliary symbol and an auxiliary reliability metrics associated with said auxiliary symbol, wherein the variable node processing unit comprises:

a sorting and redundancy elimination unit configured to process iteratively the auxiliary components and to determine components of the variable node message by iteratively sorting the auxiliary components according to a given order of the auxiliary reliability metrics and keeping a predefined number of auxiliary components comprising the auxiliary symbols that are the most reliable and all different from one another.

14 Claims, 5 Drawing Sheets

(56) References Cited

OTHER PUBLICATIONS

E. Boutillon, L. Conde-Canencia and A. Al Ghouwayel, "Design of a GF(64)-LDPC Decoder Based on the EMS Algorithm," in IEEE Transactions on Circuits and Systems I: Regular Papers, vol. 60, No. 10, pp. 2644-2656, Oct. 2013.*

I. Choi and J. Kim, "High-Throughput Non-Binary LDPC Decoder Based on Aggressive Overlap Scheduling," in IEEE Transactions on Circuits and Systems I: Regular Papers, vol. 64, No. 7, pp. 1937-1948, Jul. 2017.*

A. Voicila, D. Declercq, F. Verdier, M. Fossorier and P. Urard, "Low-complexity decoding for non-binary LDPC codes in high order fields," in IEEE Transactions on Communications, vol. 58, No. 5, pp. 1365-1375, May 2010.*

International Search Report and Written Opinion for PCT/EP2019/068040, dated Aug. 30, 2019.

Injun Choi et al: "High-Throughput Non-Binary LDPC Decoder Based on Aggressive Overlap Scheduling", IEEE Transactions on Circuits and Systems I: Regular Papers, vol. 64. No. 7. Jul. 1, 2017 (Jul. 1, 2017), pp. 1937-1948.

Youn Sung Park et al: "A Fully Parallel Nonbinary LDPC Decoder With Fine-Grained Dynamic Clock Gating", IEEE Journal of Solid-State Circuits, vol. 50, No. 2, Feb. 1, 2015 (Feb. 1, 2015), pp. 464-475.

Adrian Voicila et al: "Low-complexity decoding for non-binary LDPC codes in high order fields", IEEE Transactions on Communications. IEEE Service Center. Piscataway, NJ, USA, vol. 58, No. 5, May 1, 2010 (May 1, 2010), pp. 1365-1375.

L. Barnault and D. Declercq, "Fast decoding algorithm for LDPC over GF(q)", In Proceedings of IEEE Information Theory Workshop, pp. 70-73, Apr. 2003.

V. Savin, "Min-max decoding for non-binary LDPC codes", In Proceedings of IEEE International Symposium on Information Theory, pp. 960-964, Jul. 2008.

D. Declercq et al., "Decoding algorithms for non-binary LDPC codes over GF", IEEE Transactions on Communications, vol. 55, No. 4, pp. 633-643, Apr. 2007.

Lacruz, F. et al., "One Minimum Only Trellis Decoder for Non-Binary Low-Density Parity-Check Codes", in IEEE Transactions on Circuits and Systems I: Regular Papers, vol. 62, No. 1, pp. 177-184, Jan. 2015.

E. Li, et al., "Low latency T-EMS decoder for non-binary LDPC codes" 2013 Asilomar Conference on Signals, Systems and Computers, Pacific Grove, CA, 2013, pp. 831-835.

E. Boutillon, et al., "Design of a GF(64)-LDPC decoder based on the EMS algorithm," IEEE Transactions on Circuits and Systems I: Regular Papers, vol. 60, No. 10, pp. 2644-2656, Oct. 2013.

C. L. Lin, S. W. Tu, C. L. Chen, H. C. Chang, and C. Y. Lee, "An Efficient Decoder Architecture for non-binary LDPC Codes with Extended Min-Sum Algorithm," IEEE Transactions on Circuits and Systems II: Express Briefs, vol. 63, No. 9, pp. 863-867, Sep. 2016.

* cited by examiner

VARIABLE NODE PROCESSING METHODS AND DEVICES FOR MESSAGE-PASSING DECODING OF NON-BINARY CODES

TECHNICAL FIELD

The invention generally relates to digital communications, and in particular to methods and devices for decoding a signal encoded using a non-binary error correcting code.

BACKGROUND

Error correcting codes are implemented in various data processing systems and devices for ensuring a protection of data against errors that are introduced during data transmission or storage in the presence of noise and/or interference. Coding consists in adding redundant data to the original data, the redundant data enabling the detection and/or the correction of errors.

Error correcting codes are implemented in a wide variety of devices and systems applied for example in data communication and/or storage. Exemplary applications comprise voice and multimedia transmission for instance in wireless ad-hoc networks (e.g. standardized in Wi-Fi™ 802.11), in radio communication systems (e.g. in 3G, 4G/LTE, 5G and the like, etc.), in optical communication systems, and in digital video broadcasting (e.g. standardized in DVB-C2, DVB-S2X, and DVB-T2).

Linear error correcting codes are advantageous given that they require lower implementation complexity than non-linear error correcting codes. Exemplary linear error correcting codes comprise convolutional codes and linear block codes such as Hamming codes, Reed-Solomon codes, Turbo codes, Polar codes, and Low-Density Parity-Check (LDPC) codes.

LDPC codes, in particular, are very efficient. Non-binary LDPC codes are proven to perform close to the Shannon limit; they provide high transmission rates that approach the maximum amount of information that can be transmitted over a transmission channel. Non-binary LDPC codes are very efficient in providing high-spectral efficiency coding and perform better than binary LDPC codes. However, in order to reach such gains, developing low-complexity decoding algorithms for non-binary codes is required, especially for high spectral efficiency communications.

Decoding of signals encoded using linear block codes in general, and LDPC codes in particular, can be performed using iterative message passing algorithms.

Exemplary decoding algorithms for non-binary codes, such as non-binary LDPC codes, comprise:
 the 'q-array sum-product' algorithm disclosed for example in "L. Barnault and D. Declercq, Fast decoding algorithm for LDPC over GF (q), In Proceedings of IEEE Information Theory Workshop, pages 70-73, April 2003";
 the 'min-max' algorithm disclosed for example in "V. Savin, Min-max decoding for non-binary LDPC codes, In Proceedings of IEEE International Symposium on Information Theory, pages 960-964, July 2008";
 the 'extended min-sum' (EMS) algorithm disclosed for example in "D. Declercq and M. Fossorier, Decoding algorithms for non-binary LDPC codes over GF, IEEE Transactions on Communications, vol, 55, no. 4, pages 633-643, April 2007", and
 the 'Trellis EMS decoder' (T-EMS) disclosed for examples in "J. O. Lacruz, F. Garcia-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, January 2015" and "E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, C A, 2013, pp. 831-835".

The EMS algorithm is based on logarithmic-scale computations for reducing the computational complexity by transforming product operations to simple summation operations. Compared with other existing iterative decoding algorithms, the EMS algorithm gives a good trade-off between hardware complexity and communication performance. Nevertheless, the EMS algorithm still requires significant computational and storage resources which may not be available in practical devices or systems used for example in real-time applications or in systems which demand high throughput and a significantly reduced latency.

Message passing algorithms are based on exchanging messages representative of the encoded data between check node processing units and variable node processing units associated with a graph representation of the used code. The decoding process comprises variable node update by computing variable node messages, check node update by computing check node messages, and codeword decision making. Each check node and variable node message may comprise one or more components, a component comprising a symbol and a reliability metrics associated with the symbol. At the start of the decoding process, the variable node messages sent to the check node processing units may comprise intrinsic messages comprising intrinsic reliability metrics and intrinsic symbols. The intrinsic reliability metrics are computed from the channel output/observation only. The wording 'intrinsic' refers accordingly to the dependence of the intrinsic reliability metrics only on the (transmission) channel. Each symbol associated with an intrinsic reliability metrics is referred to as an intrinsic symbol.

The largest computational complexity involved during the decoding process using the EMS algorithm stems from the computations performed at the check node processing units and the variable node processing units.

Most existing works on non-binary error correcting codes decoding architectures focus on the processing at the check nodes rather than the variable nodes. Few works in literature are dedicated to the processing performed at the variable node processing units.

The processing at a variable node processing unit consists of three main steps: generation of intrinsic reliability metrics from a received signal, computation of variable node messages from the intrinsic reliability metrics and the check node messages received by the variable node processing unit, and a computation of local decisions. The step of computing a variable node message includes an intermediate step comprising computing components referred to as 'auxiliary components' from the intrinsic reliability metrics and the check node messages. The auxiliary components are intermediate components to be used for the generation of the components of the variable node messages. The components of the variable node messages are accordingly determined by extracting, among the auxiliary components, the components comprising the symbols that are different and the most reliable. To that end, the step of computing the variable node messages involves a sorting sub-step and a redundancy elimination sub-step. The sorting enables ordering the auxiliary components according to a given order of the reliability metrics comprised therein. The redundancy elimination enables removing redundancy and keeping, among the sorted auxiliary components, the components comprising the symbols that are different and the most reliable. This architecture of variable node processing is described in details in particular in:

C. L. Lin, S. W. Tu, C. L. Chen, H. C. Chang, and C. Y. Lee, "An Efficient Decoder Architecture for non-binary LDPC Codes with Extended Min-Sum Algorithm," IEEE Transactions on Circuits and Systems II: Express Briefs, vol. 63, no. 9, pp. 863-867, September 2016.

E. Boutillon, L. Conde-Canencia, and A. A. Ghouwayel, "Design of a GF(64)-LDPC decoder based on the EMS algorithm," IEEE Transactions on Circuits and Systems I: Regular Papers, vol. 60, no. 10, pp. 2644-2656, October 2013.

In existing variable node architectures, the sorting and redundancy elimination sub-steps are performed serially in a separate way which requires significant memorization and computational capabilities which may not be affordable especially with decoding error correcting codes constructed over high-order algebraic structures. Existing variable node architectures are complex and still require improvements in order to reduce the complexity of the variable node messages computations. There is accordingly a need for low-complexity and low-latency variable node processing techniques.

SUMMARY

In order to address these and other problems, there is provided a low-complexity and low-latency variable node processing unit implemented in a non-binary error correcting code decoder. The variable node is configured to receive one check node message and intrinsic reliability metrics derived from a received signal and to generate one variable node message from auxiliary components derived from the one check node message and the intrinsic reliability metrics, an auxiliary component comprising an auxiliary symbol and an auxiliary reliability metrics associated with said auxiliary symbol. The variable node processing unit comprises:

a sorting and redundancy elimination unit configured to process iteratively the auxiliary components and to determine components of the variable node message by iteratively sorting the auxiliary components according to a given order of the auxiliary reliability metrics and keeping a predefined number of auxiliary components comprising the auxiliary symbols that are the most reliable and all different from one another.

According to some embodiments, the variable node processing unit comprises a calculation unit configured to determine a first auxiliary message from the check node message and the intrinsic reliability metrics and a second auxiliary message from the intrinsic reliability metrics associated with a predefined number of the most reliable intrinsic symbols and a reference reliability metrics, the auxiliary components being extracted from the first auxiliary message or the second auxiliary message.

According to some embodiments, the check node message comprises check node components, each check node component comprising a symbol and a reliability metrics associated with said symbol. In such embodiments, the calculation unit may be configured to:

determine the auxiliary symbols comprised in the first auxiliary message from the symbols comprised in the check node message, an auxiliary symbol being selected from the symbols comprised in the check node components, and to determine each auxiliary reliability metrics associated with an auxiliary symbol comprised in the first auxiliary message by applying an addition operation over a predefined algebraic structure, the addition operation being applied to the intrinsic reliability metrics associated with said auxiliary symbol and a reliability metrics comprised in a check node component in association with the selected auxiliary symbol.

According to some embodiments, the variable node processing unit is further configured to receive a reference reliability metrics determined in the non-binary error correcting code decoder from an offset value and the check node component comprising the least reliable symbol. In such embodiments, the calculation unit may be configured to:

determine the auxiliary symbols comprised in the second auxiliary message from a predefined number of the most reliable intrinsic symbols associated with the lowest or the highest intrinsic reliability metrics, an auxiliary symbol being equal to an intrinsic symbol among the most reliable intrinsic symbols, and to determine the auxiliary reliability metrics associated with an auxiliary symbol comprised in the second auxiliary message by applying an addition operation over a predefined algebraic structure, the addition operation being applied to said reference reliability metrics and to the intrinsic reliability metrics associated with the intrinsic symbol equal to said auxiliary symbol.

According to some embodiments, the predefined algebraic structure is chosen in a group comprising the field of real numbers, the field of integer numbers, and the field of natural numbers.

According to some embodiments, the offset value is determined in the non-binary error correcting code decoder according to a predefined decoding performance criterion.

According to some embodiments, the variable node processing unit is configured to exchange during a number of iterations a variable node message and a check node message with at least one check node processing unit, the offset value being determined in the non-binary error correcting code decoder depending on said number of iterations, a different offset value being dynamically determined at each of said iterations.

According to some embodiments, the sorting and redundancy elimination unit comprises:

a plurality of multiplexers;

a plurality of reliability metrics comparators, and a plurality of symbol comparators;

each multiplexer being associated with a reliability metrics comparator and a symbol comparator, each multiplexer being configured to determine at each iteration a current candidate component depending on the comparisons performed by the plurality of symbol comparators and the plurality of reliability metrics comparators, the sorting and redundancy elimination unit being configured to generate, after processing all the auxiliary components comprised in the first and the second auxiliary messages, the variable node components from the candidate components comprising the symbols that are the most reliable and all different from one another.

According to some embodiments, a candidate component comprises a candidate symbol and a candidate reliability metrics associated with said candidate symbol. Each multiplexer may be configured to receive, at each iteration, at least an auxiliary component extracted from the first or the second auxiliary message and a predefined initialization component, the predefined initialization component comprising an initialization symbol and an initialization reliability metrics associated with the initialization symbol. In such embodiments, each multiplexer may be configured to determine at each iteration a current candidate component by selecting a component among the at least auxiliary component, the predefined initialization component, and a component corresponding to a candidate component determined by said multiplexer at a previous iteration, and:

the reliability metrics comparator associated with each multiplexer may be configured to perform a comparison between the auxiliary reliability metrics comprised in said at least an auxiliary component and the candidate reliability metrics comprised in the candidate component determined by each multiplexer at the previous iteration, and the symbol comparator associated with each multiplexer may be configured to check redundancy of symbols by performing a comparison between the auxiliary symbol comprised in the at least an auxiliary component and the candidate symbol comprised in the candidate component determined by said each multiplexer at the previous iteration.

According to some embodiments, at each iteration, each multiplexer 315-$j$ may be configured to:

perform a keeping action by setting the current candidate component equal to the candidate component determined at the previous iteration:

if it is determined that the auxiliary symbol comprised in the at least an auxiliary component is not redundant with none of the candidate components determined at the previous iteration and it is determined that the auxiliary symbol comprised in the at least auxiliary component is less reliable than the symbol comprised in the candidate component determined at the previous iteration by the multiplexer 315-$j$; or:

if it is determined that the auxiliary symbol comprised in the at least an auxiliary component is redundant with at least one of the symbols comprised in one of the candidate components determined by at least one of the multiplexers 315-$m$ at a previous iteration, for m varying between 1 and j−1;

perform an insertion action by setting the current candidate component equal to the auxiliary component if it is determined that the auxiliary symbol comprised in the auxiliary component is not redundant with none of the symbols comprised in the candidate components determined at the previous iteration by the multiplexers 315-$m$ at a previous iteration, for m varying between 1 and j−1 and it is determined that the auxiliary symbol comprised in the auxiliary component is more reliable than the symbol comprised in the candidate component determined by the multiplexer 315-$j$ at the previous iteration and that the auxiliary symbol is less reliable than the symbol comprised in the candidate component determined by the multiplexer 315-($j$−1) at the previous iteration;

perform a shift action by setting the current candidate component equal to the candidate component determined by the multiplexer 315-($j$−1) at a previous iteration if it is determined that the auxiliary symbol comprised in the auxiliary component is not redundant with none of the symbols comprised in the candidate components determined at the previous iteration by the multiplexers 315-$m$ for m=1, . . . , j−1 and it is determined that the auxiliary symbol comprised in the auxiliary component is more reliable than the symbol comprised in the candidate component determined by the multiplexer 315-$j$ at the previous iteration and that the auxiliary symbol is more reliable than the symbol comprised in the candidate component determined by the multiplexer 315-($j$−1) at the previous iteration.

According to some embodiments, each of the plurality of multiplexer is configured to perform an initialization action at a first iteration by setting the current candidate component equal to the initialization component.

According to some embodiments, the variable node processing unit is further configured to receive from a data processing unit in the non-binary error correcting code decoder the intrinsic reliability metrics online in response to an intrinsic reliability metrics generation request delivered by the variable node processing unit.

According to some embodiments, the variable node processing unit is further configured to load, at each iteration, at least a part of the intrinsic reliability metrics from a storage unit.

There is also provided a method for generating one variable node message from auxiliary components derived from one check node message and intrinsic reliability metrics, the intrinsic reliability metrics being derived from a received signal, an auxiliary component comprising an auxiliary symbol and an auxiliary reliability metrics associated with the auxiliary symbol. The method comprises:

determining components of the variable node message by processing the auxiliary components iteratively for sorting the auxiliary components according to a given order of the auxiliary reliability metrics and keeping a predefined number of auxiliary components comprising the auxiliary symbols that are the most reliable and all different from one another.

Advantageously, the variable node architecture according to the various embodiments of the invention has a reduced latency and requires a reduced storage and computational resources than existing architectures.

BRIEF DESCRIPTION OF DRAWINGS

The accompanying drawings, which are incorporated in and constitute a part of this specification, are provided for illustration purposes only and they illustrate various embodiments of the invention together with the general description of the invention given above, and the detailed description of the embodiments given below.

DETAILED DESCRIPTION

Embodiments of the present disclosure provide devices, methods, and computer program products for decoding a signal encoded using a non-binary error correcting code with a reduced computational complexity and a reduced latency. In particular, they provide efficient low-latency, low-memory, and low-complexity variable node processing architectures implemented in iterative message passing decoders, for decoding signals encoded using a non-binary error correcting code.

Methods, devices and computer program products according to the various embodiments may be implemented in several types of digital data transmission and storage devices and systems used in several types of applications. Exemplary devices and systems comprise but are not limited to computers, disks, laptops, phones, smartphones, recorders, base stations, drones, satellites, etc. Exemplary applications comprise magnetic and optical recording, digital television and video broadcasting, digital communications, etc.

The following description of some embodiments of the disclosure will be made with reference to digital communication systems, for illustration purposes only. However, the skilled person will readily understand that the various embodiments of the disclosure may be integrated in other types of systems used for other applications such as positioning systems memory and storage systems, and spacecraft systems.

Figure 1:
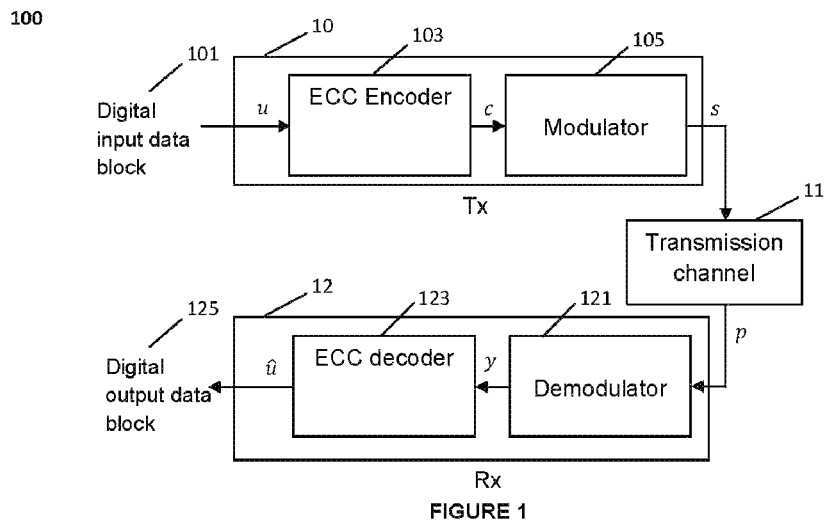
FIG. 1 is a block diagram of an exemplary application of the invention to communication systems, according to some embodiments.

Referring to FIG. 1, there is illustrated an exemplary application of the disclosure in a digital communication system 100. The communication system 100 may be for example:
  wired;
  wireless (e.g. radio or Visible Light communication systems);
  optical (e.g. optical fiber-based, laser-based);
  acoustic (e.g. underwater acoustic communication systems);
  molecular (used for example in underground structures, e.g. tunnels and pipelines or in underwater environments).

The communication system 100 may comprise at least a transmitter device 10 and a receiver device 12. The transmitter device 10 (also referred to hereinafter as a "transmitter") may be configured to communicate data information to the receiver device 12 (also referred to hereinafter as "receiver") via the transmission channel 11.

In an application of the disclosure to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the disclosure to wireless communication systems such as ad-hoc wireless networks, wireless sensor networks and radio communication systems, the transmitter 10 and receiver 12 may be any type of fixed or mobile wireless device configured to operate in a wireless environment. Exemplary devices in such applications comprise laptops, mobile phones and base stations. The transmission channel 11 may be in this case any wireless propagation medium. Further, the transmission channel 11 may accommodate several transmitters 10 and/or several receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the disclosure to optical communication systems such as optical fiber-based systems, the transmitter 10 and receiver 12 may be any optical transceiver device configured to respectively transmit and receive data information propagated over an optical link. The transmission channel 11 may be any optical fiber link designed to carry data over short or long distances. Exemplary applications using optical fiber links over short distances comprise high-capacity networks such as data center interconnections. Exemplary applications using optical fiber links over long distances comprise terrestrial and transoceanic transmissions. In such embodiments, the information symbols conveyed by the transmitter 10 may be carried by optical signals polarized according to the different polarization states of the fiber. The optical signals propagate along the fiber-based transmission channel 11, according to one or more propagation modes, until reaching the receiver 12. Exemplary optical communication systems comprise Polarization Division Multiplexing (PDM) and Mode Division Multiplexing (MDM) systems.

For any type of wired, wireless or optical communication systems, the transmission channel 11 may be any noisy channel. The noise may result from the thermal noise of the system components or the interfering radiation intercepted by antennas. Other exemplary sources of noise comprise switching, manual interruptions, electrical sparks and lightning. In some embodiments, the total noise may be modeled by an additive white Gaussian noise (AWGN).

Further, according to some embodiments in application to digital mass storage, the transmission channel 11 may be modeled for example by an erasure channel, a binary symmetric channel, or a Gaussian channel. In such embodiments, the transmission channel 11 may be any type of storage device that can be sent to (written on) and received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (acronym for Orthogonal Frequency Division Multiplexing) and FBMC (acronym for Filter Bank Multi-Carrier).

According to some embodiments of the disclosure, the transmitter 10 may comprise an error correcting code (ECC) encoder 103, configured to encode a digital input data block 101 denoted u using a non-binary error correcting code into a codeword vector denoted c. The receiver 12 may be configured to receive a noisy copy p of the encoded data, or codeword vector, through the transmission channel 11. The receiver 12 may comprise an error correcting code decoder 123 configured to deliver a digital output data block 125 as an estimate û of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to send it through the transmission channel 11.

The receiver 12 may comprise homologous processing blocks configured to perform the reverse functions. It may comprise a demodulator 121 configured to generate a signal y by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoder (referred to as 'iterative decoding algorithm') involving check node processing units and variable node processing units according to the various embodiments of the disclosure.

The following description of some embodiments of the disclosure will be made with reference to linear block non-binary error correcting codes, for illustration purposes only. However, the skilled person will readily understand that the various embodiments of the disclosure apply to any linear non-binary error correcting codes comprising non-binary convolutional codes.

Accordingly, the ECC encoder 103 may implement a linear block non-binary error correcting code designated by $\mathcal{C}(n,K)$; n and K referring respectively to the length of codeword vectors and the length of the encoded data block. The ECC encoder 103 encodes accordingly a data block u of length K into a codeword vector c, $c=(c_1, \ldots, c_n)$ being a vector of length n comprising n elements of the algebraic structure of construction of the error correcting code $\mathcal{C}(n,K)$, also referred to as "symbols".

A linear code $\mathcal{C}(n,K)$ may be represented in a matrix form, using a generator matrix denoted by G and a parity-check matrix denoted by H. Using a row notation of vectors, the generator matrix G is of dimensions K×n while the parity-check matrix has dimensions of (n−K)×n. The two matrices are linked by the relation G. $H^t=0$. In addition, entries of both matrices belong to the algebraic structure over which the error correcting code is constructed. Using the matrix representation, any codeword vector c satisfies the equation c. $H^t=0$. This equation is also called "parity-check equation". It defines n−K parity-check constraints, designed to be satisfied by any codeword vector.

In association with the matrix representation, the linear code $\mathcal{C}(n,K)$ may be represented using a bipartite graph $\mathcal{H}$ termed "Tanner graph". This graph comprises n variable nodes and n−K check nodes.

Each variable node vn∈{1, 2, . . . , n} corresponds to a column of the parity-check matrix. Each check node cn∈{1, 2, . . . , n−K} corresponds to a row of the parity-check matrix, i.e. to a parity-check equation. A variable node vn is connected to a check node cn if the entry $H_{vn,cn}$ of the parity-check matrix is equal to an element of the algebraic structure of construction of the code $\mathcal{C}(n,K)$.

$\mathcal{H}_v(vn)$ denotes the set of the check nodes connected to the variable node vn. Similarly, $\mathcal{H}_c(cn)$ denotes the set of the variable nodes connected to the check node cn.

The degree $d_{VN}$ of a variable node vn (respectively $d_{CN}$ of a check node cn) corresponds to the cardinality of the set $\mathcal{H}_v(vn)$ (respectively the cardinality of the set $\mathcal{C}_c(cn)$).

According to some embodiments, the algebraic structure of construction of the non-binary error correcting code $\mathcal{C}(n,K)$ may be any non-zero commutative division ring such as fields. Exemplary fields comprise the finite fields (also known as 'Galois fields').

The following description of some embodiments will be made with reference to finite fields, for illustration purposes only. However the skilled person will readily understand that the disclosure may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings, 23rd International Conference on Telecommunications (ICT), pp. 1-7, Thessaloniki, 2016".

For non-binary linear codes constructed over Galois Fields, generally denoted by GF(q), where q>2 designates the cardinality of the code, the symbols take values in GF(q). A codeword vector c is thus a vector of n symbols that each belong to GF(q).

The following description of some embodiments will be made with reference to an ECC encoder 103 encoding data using a non-binary LDPC code, for illustration purposes only. However, the skilled person will readily understand that the various embodiments of the disclosure also apply to other non-binary codes such as non-binary polar codes, non-binary convolutional codes, non-binary turbo codes, and in general non-binary linear block error correcting codes. Non-binary error correcting codes can advantageously be used for high spectral efficiency coding.

For exemplary purposes, in one embodiment, the ECC decoder 123 implements a non-binary LDPC codes decoder for decoding the data encoded by the ECC encoder, 103 using a non-binary LDPC code.

The description of the disclosure is made with reference to the EMS algorithm. However, the skilled person will readily understand that the various embodiments apply to any iterative non-binary LDPC codes decoder such as the min-max and the T-EMS.

Figure 2:
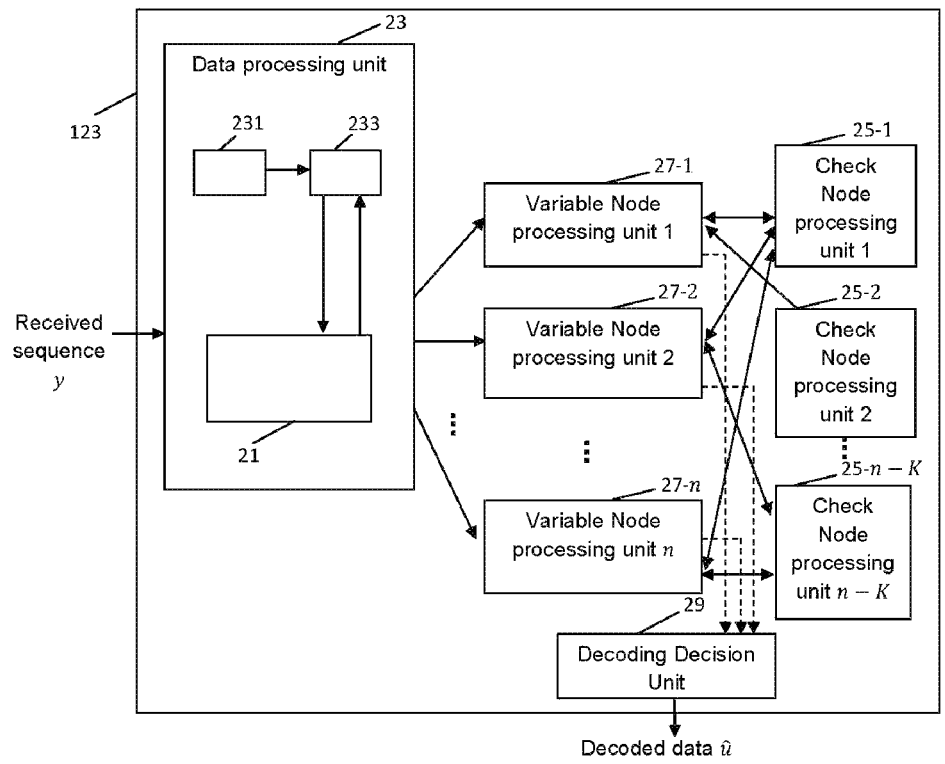
FIG. 2 is a block diagram of a non-binary error correcting code decoder, according to some embodiments in which the EMS decoding algorithm is considered.

Referring to FIG. 2, there is illustrated a structure of an iterative non-binary LDPC decoder 123 according to some embodiments using the EMS algorithm.

The iterative decoder 123 may be configured to determine an estimate û of the transmitted codeword c by the transmitter 10 from a received noisy sequence represented by a vector $y=(y_1, \ldots, y_n)$. The codeword $c=(c_1, \ldots, c_n)$ may have been encoded at the transmitter using a non-binary LDPC code designated by $\mathcal{C}(n,K)$ constructed over the Galois Field GF(q) with q>2. It may process a signal over several iterations trying, at each iteration, to reduce the remaining decoding error.

The iterative decoder 123 may be configured to determine the estimate û based on the Tanner graph representation of the code $\mathcal{C}(n,K)$ used at the transmitter 10. Each variable $\mathcal{C}$ node in the Tanner graph maps to a variable node processing unit. Each check node in the Tanner graph maps to a check node processing unit.

Accordingly, the iterative decoder 123 may comprise n variable node processing units 27 (also denoted by 27-1 to 27-n or 27-vn with vn=1, . . . , n) and n−K check node processing units 25 (also denoted by 25-1 to 25-(n−K) or 25-cn with cn=1, . . . , n−K).

The variable node processing units 27-$vn$ for $vn=1, \ldots, n$ and check node processing units 25-$cn$ for $cn=1, \ldots, n-K$ may be configured to iteratively exchange messages to estimate the most reliable codeword $\hat{u}$ from the noisy sequence y.

A message generated by a variable node processing unit 27-$vn$ is referred to as a 'variable node message'. Similarly, a message generated by a check node processing unit 25-$cn$ is referred to as a 'check node message'.

The exchanged messages between the variable node processing units 27-$vn$ and the check node processing units 25-$cn$ may carry data representative of the symbols.

According to some embodiments, the variable node and check node messages may carry values of the symbols and metrics measuring their reliabilities (also referred to hereinafter as 'reliability metrics'). The value of the reliability metrics is related to the reliability of the symbol. In such embodiments, each variable node message and check node message may comprise q components, a component comprising:
- a value of a symbol in GF(q), and
- a reliability metrics associated with the symbol.

In some embodiments, the reliability metrics of a symbol may correspond to an estimated probability density function of the symbol which represents the probability that the symbol is correct. In particular, the reliability metrics may be represented in the log-domain by a logarithmic likelihood ratio (LLR) value.

Depending on the expression of the reliability metrics, the most reliable symbols may be associated with the smallest or the greatest values of the reliability metrics.

One definition of the LLR metric involves a fixed symbol denoted by $\beta_i$ and corresponding to the most reliable symbol satisfying:

$$\beta_i = \underset{t=0,\ldots,q-1}{\mathrm{argmax}}\, p(\alpha_t \mid y_i) \quad (1)$$

In equation (1), $\alpha_t$ designates a symbol over the Galois field.

Accordingly, with the hypothesis that the symbols in the Galois field are equiprobable, for the $i^{th}$ symbol $c_i$, the LLR value for this symbol to be equal to at is noted $LLR_t(c_i)$ and may be expressed as:

$$LLR_t(c_i) = -\log\!\left(\frac{p(c_i = \alpha_t \mid y_i)}{p(c_i = \beta_i \mid y_i)}\right) \quad (2)$$

Using such definition of the LLR metrics, the most reliable symbols are those that are associated with the smallest LLR values according to equation (2).

The following description of some embodiments will be made with reference to reliability metrics represented in the logarithm domain by log-likelihood ratio (LLR) values, for illustration purposes only. However, the skilled person will readily understand that other types of decoding and reliability metrics may be used to measure the reliability of symbols. For instance, the reliability metrics may be a quadratic distance or any monotonic function of the probability density function of symbols.

The processing performed by the various variable node processing units 27-$vn$ and check node processing units 25-$cn$ may be implemented according to several scheduling mechanisms including, without limitation, the three examples described in the following.

According to a first implementation, all the variable node processing units 27-$vn$ for $vn=1, \ldots, n$, may be configured to operate in a first round and then all the check node processing units 25-$cn$, for $cn=1, \ldots, n-K$, may be configured to update the check node messages to be delivered to the variable node processing units in their corresponding sets $\mathcal{H}_c(cn)$. This specific scheduling is known as "flooding scheduling". In particular, the check node processing units 25-$cn$ may be configured to operate serially or in parallel, where from 2 to (n−K) check node processing units 25-$cn$ may operate at the same time.

According to a second implementation based on a "horizontal scheduling", the check node processing units 25-$cn$, for $cn=1, \ldots, n-K$, may be configured to operate serially, updating all variable node processing units 27-$vn$ which are connected to them. In particular, a group of check node processing units 25-$cn$ may be configured to operate in parallel, updating all connected variable node processing units 27-$vn$ provided that there is no variable node processing unit 27-$vn$ in conflict (e.g. when two check node processing units 25-$cn$ are connected to the same variable node processing unit 27-$vn$).

According to a third implementation based on a "vertical scheduling", the variable node processing units 27-$vn$ may be configured to operate serially, updating all check node processing units 25-$cn$ which are connected to them.

The iterative decoder 123 may comprise a data processing unit 23 configured to determine intrinsic symbols and intrinsic reliability metrics from the received signal, an intrinsic symbol denoted $x \in GF(q)$ and that belongs to the Galois field (in general to the algebraic structure of the non-binary error correcting code) being associated with an intrinsic reliability metrics denoted $I^+(x)$. More specifically, the data processing unit 23 may comprise:
- a symbol generator 231 configured to generate intrinsic symbols x that belong to the algebraic structure over which the non-binary error correcting code is constructed, and
- an intrinsic reliability metrics generator unit 233 configured to generate the intrinsic reliability metrics $I^+(x)$ associated with each intrinsic symbol x from the received signal. Using the LLR notation of equation (2), the intrinsic reliability metrics associated with a symbol x may be determined in logarithmic scale according to:

$$I^+(x) = -\log\!\left(\frac{p(x = \alpha_t \mid y_i)}{p(x = \beta_i \mid y_i)}\right) \quad (3)$$

In equation (3), $\beta_i$ refers to the most reliable symbol previously defined in equation (1).

According to some embodiments, the intrinsic reliability metrics generator unit 233 may be configured to load the received signal y from a storage unit 21, the storage unit 21 being configured to store the received signal y.

In some embodiments illustrated in FIG. 2, the storage unit 21 may be comprised within the data processing unit 23.

In other embodiments (not illustrated in FIG. 2), the storage unit 21 may be comprised in the iterative decoder 123 outside the data processing unit 23.

According to some embodiments, the intrinsic reliability metrics generator unit 233 may be configured to determine at least a part of the intrinsic reliability metrics offline, before the starting of the iterative decoding process. In such embodiments, the intrinsic reliability metrics generator unit 233 may be further configured to store at least a part of the computed intrinsic reliability metrics in the storage unit 21. Such embodiments may be advantageously implemented for decoding codes constructed over algebraic structures of small orders.

In some embodiments, the intrinsic reliability metrics generator unit 233 may be configured to determine the intrinsic reliability metrics online during the iterative decoding process. Such embodiments may be advantageously implemented for decoding high-order non-binary error correcting codes enabling memorization savings.

In some embodiments, the intrinsic reliability metrics generator unit 233 may be configured to determine at least some of the intrinsic reliability metrics offline and to determine the remaining intrinsic reliability metrics online.

According to some embodiments (illustrated in FIG. 2), the iterative decoder 123 may comprise a single data processing unit 23 configured to determine intrinsic reliability metrics to be delivered to all of the variable node processing units 27-vn for vn=1, ..., n.

In other embodiments (not illustrated here), the iterative decoder 123 may comprise a plurality of data processing units 23-vn for vn=1, ..., n, each data processing unit 23-vn being comprised in a variable node processing unit 23-vn, for vn=1, ..., n.

A variable node processing unit 27-vn may be configured to receive intrinsic reliability metrics derived from the received signal y and to receive check node messages from the check node processing units 25-cn corresponding to the set $\mathcal{H}_v(vn)$. A variable node processing unit 27-vn may be further configured to process the received check node messages and intrinsic reliability metrics, compute local decisions, and deliver variable node messages to at least one check node processing unit 25-cn corresponding to the check nodes in the set $\mathcal{H}_v(vn)$.

Similarly, a check node processing unit 25-cn may be configured to process variable node messages sent by the variable node processing units 27-vn corresponding to the set $\mathcal{H}_c(cn)$. A check node processing unit 25-cn may be further configured to deliver check node messages to at least one variable node processing unit 27-vn corresponding to the variable nodes in the set $\mathcal{H}_c(cn)$.

The exchange of messages may be started by the variable node processing units 27-vn. It may terminate either if the processed signal satisfies the parity-check equation or if a maximum number of iterations is reached without meeting all parity-check constraints.

Accordingly, the iterative decoder 123 may comprise a decoding decision unit 29 configured to receive, at each iteration of the decoding process, the local decisions computed by the variable node processing units 27-vn and to:
 deliver the processed signal as an estimate of the original codeword vector if the processed signal satisfies the parity-check equation; or
 declare a decoding failure but nevertheless output the codeword vector estimated at the last iteration if a maximum number of iterations is reached without meeting all parity-check constraints.

The various embodiments of the disclosure provide efficient low-complexity and low-latency techniques for variable node processing of degree two ($d_{VN}=2$) implemented in an iterative non-binary error correcting code decoder, the variable node processing unit being configured to:

receive intrinsic reliability metrics derived from the received signal y and one check node message from a check node processing unit in the set $\mathcal{H}_v(vn)$, and
to generate one variable node message from the check node message and the intrinsic reliability metrics.

Figure 3:
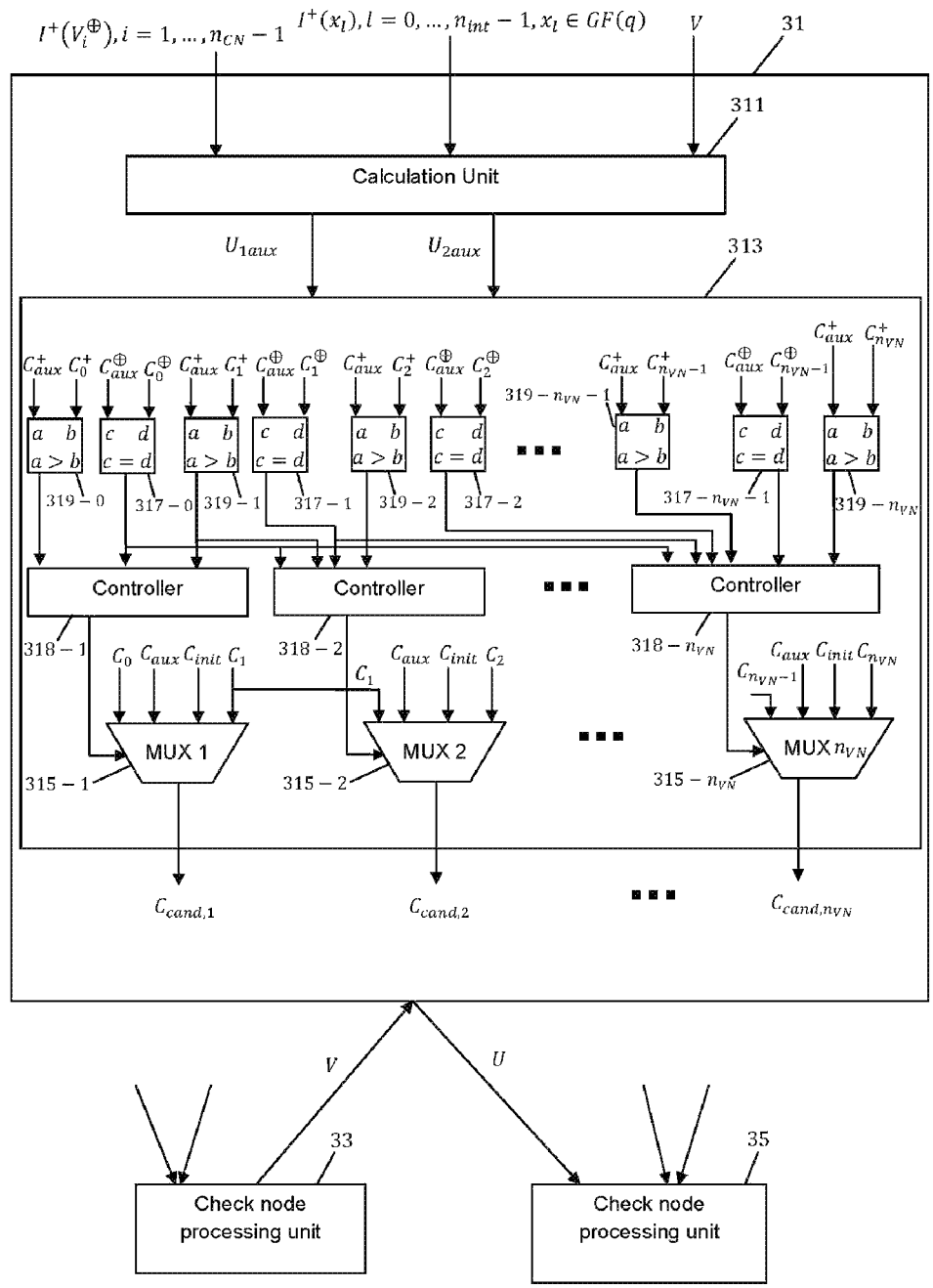
FIG. 3 is a block diagram illustrating the structure of a variable node processing unit, according to some embodiments in which the variable node processing unit is of degree two.

FIG. 3 is a block diagram illustrating the structure of a variable node processing unit 31 of degree $d_{VN}=2$, configured to receive one check node message denoted V from a check node processing unit 33 and intrinsic reliability metrics, and to determine a variable node message denoted U and to deliver the variable node message U to a check node processing unit 35 different from the check node processing unit 33.

In the following, the components comprised in a variable node message are referred to as 'variable node components' and the components comprised in a check node message are referred to as 'check node components'.

According to some embodiments using the EMS algorithm, the variable node message and/or the check node message may be sorted according to their reliability i.e. according to a given order (for example increasing or decreasing) of the reliability metrics comprised therein. Further, the variable node message may be truncated so as to keep only a predefined number $n_{VN}$ of the most reliable variable node components, with $n_{VN}$ being strictly lower than q ($n_{VN}<q$). Similarly, the check node message may be truncated so as to keep only a predefined number $n_{CN}$ of the most reliable check node components, with $n_{CN}$ being strictly lower than q ($n_{CN}<q$). Further, the sorting and truncation operations may be performed by the variable node processing unit 31 or by the check node processing units 33 and/or the check node processing unit 35.

In an embodiment, the predefined number of variable node components $n_{VN}$ and the predefined number of check node components $n_{CN}$ may be different, i.e. $n_{VN} \neq n_{CN}$.

In another embodiment, the predefined number of variable node components $n_{VN}$ and the predefined number of check node components $n_{CN}$ may be identical, i.e. $n_{VN}=n_{CN}$.

The following description of the embodiments of the disclosure for purpose of clarity and simplification, will be made with reference to sorted and truncated check node message V and variable node message U, the number of check node components and variable node components being equal or different. But the skilled person will readily understand that the disclosure applies to check node messages and variable node message comprising unsorted components.

Accordingly, the check node message V may comprise $n_{CN}$ check node components denoted by $V_i=(V_i^\oplus, V_i^+)$ for i=0, ..., $n_{CN}-1$, a check node component $V_i=(V_i^\oplus, V_i^+)$ comprising a symbol $V_i^\oplus$ that belongs to the Galois field GF(q) and a reliability metrics $V_i^+$ associated with the symbol $V_i^\oplus$. The check node components may be sorted according to a decreasing reliability corresponding to a given order (increasing or decreasing) of the reliability metrics $V_i^+$ such that $V_i^+ \leq V_{i+1}^+$ for i=0, ..., $n_{CN}-2$ and the component comprising the most reliable symbol is $V_0=(V_0^\oplus, V_0^+)$.

The variable node message U may comprise $n_{VN}$ variable node components denoted by $U_t=(U_t^\oplus, U_t^+)$ for t=0, ..., $n_{VN}-1$, a variable node component $U_t=(U_t^\oplus, U_t^+)$ comprising a symbol $U_t^\oplus$ that belongs to the Galois field GF(q) and a reliability metrics $U_t^+$ associated with the symbol $U_t^\oplus$. The variable node components may be sorted according to a decreasing reliability corresponding to a given order (increasing or decreasing) of the reliability metrics $U_t^+$ such that $U_t^+ \leq U_{t+1}^+$ for $t=0, \ldots, n_{VN}-2$ and the component comprising the most reliable symbol is $U_0=(U_0^\oplus, U_0^+)$.

Further, the following notations will be used in the following description:

- $n_{int}$ denotes a predefined number of the most reliable intrinsic symbols that belong to the algebraic structure of construction of the non-binary error correcting code;
- $x_l \in GF(q)$ for $l=0, \ldots, n_{int}-1$ refer to the $n_{int}$ most reliable intrinsic symbols that belong to the algebraic structure of construction of the non-binary error correcting code such that the most reliable intrinsic symbol is $x_0$;
- $I^+(x_l)$ refers to an intrinsic reliability metrics associated with the intrinsic symbol $x_l$ that belongs to the algebraic structure of the non-binary error correcting code, the intrinsic reliability metrics $I^+(x_l)$ being derived from the received sequence/signal y;
- $U_{1aux}$ refers to a first auxiliary message comprising $n_{CN}$ auxiliary components denoted $U_{1aux,i}=(U_{1aux,i}^\oplus, U_{1aux,i}^+)$ with $i=0, \ldots, n_{CN}-1$, an auxiliary component $U_{1aux,i}$ comprising an auxiliary symbol $U_{1aux,i}^\oplus$ and an auxiliary reliability metrics $U_{1aux,i}^+$ associated with the symbol $U_{1aux,i}^\oplus$;
- $U_{2aux}$ refers to a second auxiliary message comprising $n_{int}$ auxiliary components denoted $U_{2aux,l}=(U_{2aux,l}^\oplus, U_{2aux,l}^+)$ with $l=0, \ldots, n_{int}-1$, an auxiliary component $U_{2aux,l}$ comprising an auxiliary symbol $U_{2aux,l}^\oplus$ and a n auxiliary reliability metrics $U_{2aux,l}^+$ associated with the symbol $U_{2aux,l}^\oplus$;
- $U_{aux,r}=(U_{aux,r}^\oplus, U_{aux,r}^+)$, with r taking value between 0 and $n_{int}+n_{CN}-1$, refers to an auxiliary component extracted from the first auxiliary message or the second auxiliary message. The auxiliary component may comprise an auxiliary symbol $U_{aux,r}^\oplus$ and an auxiliary reliability metrics $U_{aux,r}^+$ associated with the symbol $U_{aux,r}^\oplus$;
- J refers to an offset value determined by the iterative decoder 123, the offset value J may be an integer number higher than or equal to zero ($J \geq 0$);
- $C_{ref}^+$ refers to a reference reliability metrics (also referred to as 'a default reliability metrics') determined from the reliability metrics $V_{n_{CN}-1}^+$ comprised in the check node component $V_{n_{CN}-1}$ comprising the least reliable symbol (also referred to as 'reference check node component' or 'default check node component') and the offset value J according to:

$$C_{ref}^+ = J + V_{n_{CN}-1}^+ \quad (4)$$

The reference reliability metrics refers to its computation involving the reliability metrics associated with the reference check node component comprising the least reliable symbol;

- $C_0=(C_0^\oplus, C_0^+)$ refers to a predefined candidate component comprising a predefined candidate symbol $C_0^\oplus$ and a predefined candidate reliability metrics $C_0^+$. In some embodiments, the predefined candidate symbol $C_0^\oplus$ may be chosen from an algebraic structure different from the algebraic structure of construction of the non-binary error correcting code. In some embodiments, the predefined candidate reliability metrics $C_0^+$ may be equal to a predefined minimum value;
- $C_j=(C_j^\oplus, C_j^+)$, with j taking value between 1 and $n_{VN}$, refers to a candidate component comprising a candidate symbol $C_j^\oplus$ and a candidate reliability metrics $C_j^+$ associated with the candidate symbol $C_j^\oplus$, a candidate component corresponding to a component determined at the iterative sorting and redundancy elimination operations;
- $C_{init}=(C_{init}^\oplus, C_{init}^+)$ refers to a predefined 'initialization component' comprising an initialization symbol $C_{init}^\oplus$ and an initialization reliability metrics $C_{init}^+$ associated with the initialization symbol $C_{init}^\oplus$;
- $C_{cand,j}=(C_{cand,j}^\oplus, C_{cand,j}^+)$, with j taking value between 1 and $n_{VN}$, refers to a current candidate component determined at a current iteration of the iterative sorting and redundancy elimination process, the current candidate component comprising a current candidate symbol $C_{cand,j}^\oplus$ and a current candidate reliability metrics $C_{cand,j}^+$ associated with the current candidate symbol $C_{cand,j}^\oplus$.

According to some embodiments, the variable node processing unit 31 may be configured to receive a predefined number $n_{int}$ of intrinsic reliability metrics $I^+(x_l)$, $l=0, \ldots, n_{int}-1$ associated with the $n_{int}$ most reliable intrinsic symbols and $n_{CN}$ intrinsic reliability metrics $I^+(V_i^\oplus)$, $i=0, \ldots, n_{CN}-1$ associated with the symbols $V_i^\oplus$ comprised in the check node message V. The variable node processing unit 31 may be configured to receive the $n_{int}+n_{CN}$ intrinsic reliability metrics from the data processing unit 23.

Given the received check node message V and the $n_{int}+n_{CN}$ intrinsic reliability metrics (loaded from the storage unit 21 or received online from the intrinsic reliability metrics generator unit 233), the variable node processing unit 31 may be configured to determine the $n_{VN}$ variable node components $U_t=(U_t^\oplus, U_t^+)$, $t=0, \ldots, n_{VN}-1$ from $n_{CN}+n_{int}$ auxiliary components $U_{aux,r}=(U_{aux,r}^\oplus, U_{aux,r}^+)$, with $r=0, \ldots, n_{int}+n_{CN}-1$, the auxiliary components being derived from the check node message V and the $n_{int}+n_{CN}$ intrinsic reliability metrics $I^+(x_l)$, $l=0, \ldots, n_{int}-1$ and $I^+(V_i^\oplus)$, $i=0, \ldots, n_{CN}-1$. More specifically, the variable node processing unit 31 may comprise:

- a calculation unit 311 configured to compute a first auxiliary message $U_{1aux}$ from the check node message V and the intrinsic reliability metrics $I^+(V_i^\oplus)$, $i=0, \ldots, n_{CN}-1$ associated with the symbols comprised in the check node message V and to compute a second auxiliary message $U_{2aux}$ from the intrinsic reliability metrics $I^+(x_l)$, $l=0, \ldots, n_{int}-1$ associated with a predefined number $n_{int}$ of the $n_{int}$ most reliable intrinsic symbols $x_l \in GF(q)$ and the reference reliability metrics $C_{ref}^+$. The first auxiliary message $U_{1aux}$ may comprise $n_{CN}$ auxiliary components $U_{1aux,i}=(U_{1aux,i}^\oplus, U_{1aux,i}^+)$ with $i=0, \ldots, n_{CN}-1$ and the second auxiliary message $U_{2aux}$ may comprise $n_{int}$ auxiliary components $U_{2aux,l}=(U_{2aux,l}^\oplus, U_{2aux,l}^+)$ for $l=0, \ldots, n_{int}-1$;
- a sorting and redundancy elimination unit 313 configured to process iteratively at least an auxiliary component $U_{aux,r}$ extracted from the first or the second auxiliary message, the redundancy elimination and sorting unit 313 being configured to determine components of the variable node message by iteratively sorting the auxiliary components $U_{1aux,i}$ and $U_{2aux,l}$ and keeping a predefined number $n_{VN}$ of auxiliary components comprising the auxiliary symbols that are the most reliable and all different from one another. The iterative sorting and redundancy elimination operations refer to the processing of the auxiliary components comprised in the first and second auxiliary messages iteratively in such a way that at least an auxiliary component is processed at each iteration. An iteration may correspond to a processing time interval (for example a clock cycle).

The following description will be made with reference to processing an auxiliary component at each iteration according to which the sorting and redundancy elimination unit 313 may be configured to process, at each iteration, an auxiliary component. However, the skilled person will readily understand that the disclosure applies to the processing of two or more auxiliary components at each of one or more iterations.

Accordingly, the calculation unit 311 may be configured to:

determine the auxiliary symbols $U_{1aux,i}^{\oplus}$ for i=0, ..., $n_{CN}$−1 comprised in the first auxiliary message $U_{1aux}$ from the symbols $V_i^{\oplus}$ comprised in the check node message V, the auxiliary symbol being selected from the symbols comprised in the check node components according to:

$$U_{1aux,i}^{\oplus}=V_i^{\oplus}, i=0, \ldots, n_{CN}-1 \quad (5)$$

determine each auxiliary reliability metrics $U_{1aux,i}^+$ associated with an auxiliary symbol $U_{1aux,i}^{\oplus}$ comprised in the first auxiliary message $U_{1aux}$ by applying an addition operation over a predefined algebraic structure chosen in a group comprising the field of real numbers, the field of integer numbers, and the field of natural numbers, the addition operation being applied to the intrinsic reliability metrics $I^+(V_i^{\oplus})$ associated with the auxiliary symbol $U_{1aux,i}^{\oplus}$ and a reliability metrics $V_i^+$ comprised in a check node component $V_i=(V_i^{\oplus},V_i^+)$ in association with a symbol $V_i^{\oplus}$ equal to the selected auxiliary symbol $U_{1aux,i}^{\oplus}=V_i^{\oplus}$ according to:

$$U_{1aux,i}^+ = I^+(V_i^{\oplus})+V_i^+, i=0, \ldots, n_{CN}-1 \quad (6)$$

According to some embodiments, the non-binary error correcting code decoder 123 may be further configured to determine an offset value J and to determine a reference reliability metrics $C_{ref}^+$, from the check node component comprising the least reliable symbol and the offset value according to equation (4). In such embodiments, the calculation unit 311 may be configured to:

determine the auxiliary symbols $U_{2aux,l}^{\oplus}$, comprised in the second auxiliary message $U_{2aux}$ from the predefined number $n_{int}$ of the most reliable intrinsic symbols $x_l$ associated with the highest or lowest intrinsic reliability metrics $I^+(x_l)$ for l=0, ..., $n_{int}$−1, an auxiliary symbol $U_{2aux,l}^{\oplus}$ being equal to an intrinsic symbol $x_l$ for l=0, ..., $n_{int}$−1 according to:

$$U_{2aux,l}^{\oplus}=x_l, l=0, \ldots, n_{int}-1 \quad (7)$$

determine the auxiliary reliability metrics $U_{2aux,l}^+$ associated with an auxiliary symbol $U_{2aux,l}^{\oplus}$ comprised in the second auxiliary message $U_{2aux}$ by applying an addition operation over the predefined algebraic structure, the addition operation being applied to the reference reliability metrics $C_{ref}^+$ and to the intrinsic reliability metrics $I^+(U_{2aux,l}^{\oplus})$ associated with the intrinsic symbol $x_l$ equal to said auxiliary symbol $x_l=U_{2aux,l}^{\oplus}$ according to:

$$U_{2aux,l}^+=C_{ref}^+ + I^+(x_l), l=0, \ldots, n_{int}-1 \quad (8)$$

According to some embodiments, the decoder 123 may be configured to first determine the number $n_{int}$ of the intrinsic reliability metrics associated with the most reliable intrinsic symbols depending on one or more parameters chosen in a group comprising a signal-to-noise ratio, the number of iterations of the decoding process, and the algebraic structure of the non-binary error correcting code.

According to some embodiments, the decoder 123 may be configured to determine the number $n_{int}$ of the intrinsic reliability metrics associated with the most reliable intrinsic symbols depending on the number of check node components $n_{CN}$, the number of intrinsic reliability metrics being strictly lower than the number of check node components $n_{int}<n_{CN}$.

According to some embodiments, the non-binary error correcting code decoder 123 may be configured to determine the offset value J according to a predefined decoding performance criterion.

According to some embodiments, the non-binary error correcting code decoder 123 may be configured to determine the offset value J depending on the number of iterations of the messages exchange between the variable node processing unit 31 and the check node processing unit 33 and/or the check node processing unit 35, a different offset value j being dynamically determined at each iteration of the decoding process.

Further, according to some embodiments with reference to FIG. 2, the non-binary error correcting code decoder 123 may be configured to determine a different offset value j for each variable node processing unit 27-vn for vn=1, ..., n.

According to some embodiments illustrated in FIG. 3, the sorting and redundancy elimination unit 313 may be configured to perform the iterative sorting and redundancy elimination to generate the variable node components by the implementation of multiplexers and comparators. Accordingly, in some embodiments, the sorting and redundancy elimination unit 313 may comprise:

a plurality of multiplexers 315-j with j=1, ..., $n_{VN}$;

a plurality of reliability metrics comparators 319-j with j=0, ..., $n_{VN}$, comprising a first reliability metrics comparator 319-0 and one or more reliability metrics comparators 319-j for j=1, ..., $n_{VN}$ and a plurality of symbol comparators 317-j with j=0, ..., $n_{VN}$−1 comprising a first symbol comparator 317-0 and one or more symbols comparators 317-j with j=1, ..., $n_{VN}$−1.

Each multiplexer 315-j may be associated with a reliability metrics comparator 319-j and a symbol comparator 317-j. In particular, the multiplexer 315-1 may be associated with the reliability metrics comparators 319-0 and 319-1 and the symbol comparators 317-0, the multiplexer 315-$n_{VN}$ may be associated only with a reliability metrics comparator 319-$n_{VN}$. Each multiplexer 315-j (for j=1, ..., $n_{VN}$) may be configured to determine at each iteration (e.g. at each clock cycle) a current candidate component depending on the comparisons performed by the plurality of symbols comparators 317-j and the plurality of reliability metrics comparators 319-j. In particular, the sorting and redundancy elimination unit 313 may comprise a plurality of controllers 318-j for j=1, ..., $n_{VN}$, each controller 318-j being associated with a multiplexer 315-j and being configured to perform, at each iteration, a control action (also referred to as 'action') to the multiplexer 315-j, depending on the comparisons performed by the symbols comparators 317-m for m=0, ..., j−1.

The auxiliary components of the first auxiliary message may not be sorted, even if the check node components are sorted, because of the addition operation involving the intrinsic reliability metrics associated with the symbols comprised in the check node messages. The sorting and redundancy elimination unit 313 is thus used for sorting the auxiliary components, according to a given order of the auxiliary reliability metrics, and enabling a generation of sorted variable node components derived from the sorted auxiliary components.

Further, the auxiliary components comprised in the first auxiliary message and the second auxiliary message may comprise redundant symbols, i.e. may comprise two or more auxiliary components that comprise a same value of one or more auxiliary symbols. The symbols comparators 317-$j$ are used for redundancy elimination in order to keep, among the auxiliary components, the components that comprise the most reliable different symbols and to enable a generation of the most reliable variable node components comprising different symbols.

At each iteration (e.g. at each clock cycle), a control action performed by a controller 318-$j$ to a multiplexer 315-$j$ may consist of an initialization action, a keeping action, an insertion action, or a shift action.

Concurrently to the processing of all the $n_{CN}+n_{int}$ auxiliary components (i.e. concurrently to $n_{CN}+n_{int}$ iterations) comprised in the first and the second auxiliary messages ($n_{CN}$ auxiliary components comprised in the first auxiliary message and $n_{int}$ auxiliary components comprised in the second auxiliary message), the sorting and redundancy elimination unit 313 may be configured to generate the variable node components from the candidate components comprising the most reliable different symbols.

According to some embodiments in which one or more auxiliary components are processed at each iteration, each multiplexer 315-$j$ for $j=1, \ldots, n_{VN}$ may be configured to receive, at each iteration (e.g. at each clock cycle), at least an auxiliary component $C_{aux}=(C_{aux}^{\oplus},C_{aux}^{+})=U_{aux,r}=(U_{aux,r}^{\oplus}, U_{aux,r}^{+})$ extracted from the first auxiliary message or from the second auxiliary message and a predefined initialization component $C_{init}$, each multiplexer 315-$j$ for $j=1, \ldots, n_{VN}$ being configured to determine a current candidate component $C_{cand,j}$ by selecting a component among the at least auxiliary component $C_{aux}$, the predefined initialization component $C_{init}$, and a component $C_j=(C_j^{\oplus}, C_j^{+})$ corresponding to a candidate component determined by the multiplexer 315-$j$ at a previous iteration. In such embodiments:

the reliability metrics comparator 319-$j$ associated with the multiplexer 315-$j$ may be configured to perform a comparison between the at least one auxiliary reliability metrics $C_{aux}^{+}$ comprised in the auxiliary component $C_{aux}$ and the reliability metrics $C_j^{+}$ comprised in the candidate component $C_j$ determined by the multiplexer 315-$j$ at the previous iteration, and the symbol comparator 317-$j$ associated with each multiplexer 315-$j$ may be configured to check redundancy of symbols by performing a comparison between the auxiliary symbol $C_{aux}^{\oplus}$ comprised in the auxiliary component $C_{aux}$ and the symbol $C_j^{\oplus}$ comprised in the candidate component $C_j$ determined by the multiplexer 315-$j$ at the previous iteration.

In some embodiments in which an auxiliary component is processed at each iteration, each multiplexer 315-$j$ for $j=1, \ldots, n_{VN}$ may be configured to receive, at each iteration (e.g. at each clock cycle), an auxiliary component extracted from the first auxiliary message or from the second auxiliary message and a predefined initialization component, and to determine a current candidate component $C_{cand,j}$ by selecting a component among the auxiliary component $C_{aux}$, the predefined initialization component $C_{init}$, and a component $C=(C_j^{\oplus},C_j^{+})$ corresponding to a candidate component determined by the multiplexer 315-$j$ at a previous iteration.

The description of the following embodiments will be made with reference to an increasing order of the reliability metrics, according to which a most reliable symbol is associated with the smallest reliability metrics and with reference to processing an auxiliary component at each iteration, for illustration purposes only.

Accordingly, in some embodiments, each multiplexer 315-$j$ for $j=1, \ldots, n_{VN}$ receiving an auxiliary component $C_{aux}$ may be configured to:

perform a keeping action by setting the current candidate component $C_{cand,j}$ equal to the candidate component $C_j$ determined at the previous iteration:
if the auxiliary symbol $C_{aux}^{\oplus}$ comprised in the auxiliary component $C_{aux}$ is not redundant with none of the candidate components $C_m$ for $m=1, \ldots, j-1$ determined at the previous iteration by the multiplexers 315-$m$ for $m=1, \ldots, j-1$ (i.e. if, for each m varying between 1 and $j-1$, each symbol comparator 317-$m$ associated with each multiplexer 315-$m$ determines that $C_{aux}^{\oplus} \neq C_m^{\oplus}$), and the auxiliary symbol $C_{aux}^{\oplus}$ comprised in the auxiliary component $C_{aux}$ is less reliable than the symbol $C_j^{\oplus}$ comprised in the candidate component $C_j$ determined at the previous iteration by the multiplexer 315-$j$ (i.e. if, for an increasing order of the reliability metrics, the reliability metrics comparator 319-$j$ associated with the multiplexer 315-$j$ determines that $C_{aux}^{+} \geq C_j^{+}$; or
if the auxiliary symbol $C_{aux}^{\oplus}$ comprised in the auxiliary component $C_{aux}$ is redundant with at least one of the symbols $C_l^{\oplus}$ comprised in one of the candidate components C determined by at least one of the multiplexers 315-$l$ at a previous iteration, for l varying between 1 and $j-1$ (i.e. at least one symbol comparator 317-$l$ associated with a multiplexer 315-$l$ determines that $C_{aux}^{\oplus}=C_l^{\oplus}$ for at least one index l taking value between 1 and $j-1$). According to the keeping action, the multiplexer 315-$j$ does not perform any specific action and keeps the candidate component previously selected during the previous iteration as the current candidate component. Accordingly, $C_{cand,j}^{\oplus}=C_j^{\oplus}$ and $C_{cand,j}^{+}=C_j^{+}$;

perform an insertion action by setting the current candidate component $C_{cand,j}$ equal to the auxiliary component $C_{aux}$ if the auxiliary symbol $C_{aux}^{\oplus}$ comprised in the auxiliary component $C_{aux}$ is not redundant with none of the symbols $C_l^{\oplus}$ comprised in the candidate components C for $l=1, \ldots, j-1$ determined at the previous iteration (i.e. if each of the symbol comparators 317-$l$ for $l=1, \ldots, j-1$ determines that $C_{aux}^{\oplus} \neq C_l^{\oplus}$) and the auxiliary symbol $C_{aux}^{\oplus}$ comprised in the auxiliary component $C_{aux}$ is more reliable than the symbol $C_j^{\oplus}$ comprised in the candidate component $C_j$ determined by the multiplexer 315-$j$ at the previous iteration and that the auxiliary symbol $C_{aux}^{\oplus}$ is less reliable than the symbol $C_{j-1}^{\oplus}$ comprised in the candidate component $C_{j-1}$ determined by the multiplexer 315-$j-1$ at the previous iteration (i.e. if the reliability metrics comparator 319-$j$ associated with the multiplexer 315-$j$ determines that $C_{aux}^{+}<C_j^{+}$ and that the reliability metrics comparator 319-$j-1$ associated with the multiplexer 315-$j-1$ determines that $C_{aux}^{+} \geq C_{j-1}^{+}$). According to the insertion action, the multiplexer 315-$j$ may be configured to select the auxiliary component as the current candidate component, replacing thus the candidate component previously selected during the previous iteration by the auxiliary component such that $C_{cand,j}^{\oplus}=C_{aux}^{\oplus}$ and $C_{cand,j}^{+}=C_{aux}^{+}$;

perform a shift action by setting the current candidate component $C_{cand,j}$ equal to the candidate component $C_{j-1}$ determined by the multiplexer 315-$(j-1)$ at a previous iteration if the auxiliary symbol $C_{aux}^{\oplus}$ comprised in the auxiliary component $C_{aux}$ is not redundant with none of the symbols $C_l^{\oplus}$ comprised in the candidate components $C_l$ for $l=1, \ldots, j-1$ determined at the previous iteration (i.e. if each of the symbol comparators 317-$l$ for l=1, ..., j−1 determines that $C_{aux}^{\oplus} \neq C_l^{\oplus}$) and the auxiliary symbol $C_{aux}^{\oplus}$ comprised in the auxiliary component $C_{aux}$ is more reliable than the symbol $C_j^{\oplus}$ comprised in the candidate component $C_j$ determined by the multiplexer 315-$j$ at the previous iteration and that the auxiliary symbol $C_{aux}^{\oplus}$ is more reliable than the symbol $C_{j-1}^{\oplus}$ comprised in the candidate component $C_{j-1}$ determined by the multiplexer 315-$j$−1 at the previous iteration (i.e. if the reliability metrics comparator 319-$j$ associated with the multiplexer 315-$j$ determines that $C_{aux}^+ < C_j^+$ and that the reliability metrics comparator 319-$j$−1 associated with the multiplexer 315-$j$−1 determines that $C_{aux}^+ < C_{j-1}^+$). According to the shift action, each multiplexer 315-$j$ may be configured to select the candidate component $C_{j-1}$ determined by the multiplexer 315-($j$−1) as the current candidate component $C_{cand,j}$ such that $C_{cand,j}^{\oplus} = C_{j-1}^{\oplus}$, $C_{cand,j}^+ = C_{j-1}^+$.

It should be noted that, for comparisons performed in association with the multiplexer 315-1, the predefined candidate component $C_0$ is considered during the symbol and reliability metrics comparisons. The skilled person will readily understand that the actions determined by the controller 315-1 in such embodiments may be advantageously simplified, given that the predefined candidate component comprises constant values of the predefined candidate symbol and the predefined reliability metrics.

According to some embodiments, for the initialization of the candidate components at a first iteration, each multiplexer 315-$j$ for j=1, ..., $n_{VN}$ may be configured to perform an initialization action by setting the current candidate component $C_{cand,j}$ equal to the initialization component $C_{init} = (C_{init}^{\oplus}, C_{ref}^+)$ such that $C_{cand,j}^{\oplus} = C_{init}^{\oplus}$ and $C_{cand,j}^+ = C_{init}^+$. The initialization component may comprise constant values of the initialization symbol and the initialization reliability metrics. Accordingly, each of the plurality of multiplexers 315-$j$ for j=1, ..., $n_{VN}$ may be configured to determine an initial candidate component from said initialization component. Accordingly, before starting the processing of the auxiliary components extracted from the first or the second auxiliary message, the $j^{th}$ multiplexers 315-$j$ may be configured to initialize the candidate component $C_j$ and the current candidate component $C_{cand,j}$ to the initialization component $C_{init}$ such that the candidate symbol and the current candidate symbol are equal to the initialization symbol according to $C_j^{\oplus} = C_{cand,j}^{\oplus} = C_{init}^{\oplus}$ and that the reliability metrics $C_j^+$ associated with the candidate symbol $C_j^{\oplus}$ and the reliability metrics associated with the current candidate symbol $C_{cand,j}^{\oplus}$ are equal to the initialization reliability metrics according to $C_j^+ = C_{cand,j}^+ = C_{init}^+$.

In some embodiments, the initialization symbol may be chosen from an algebraic structure different from the algebraic structure of construction of the non-binary error correcting code. In some embodiments, the initialization reliability metrics may be a predefined maximum value.

According to some embodiments, the variable node processing unit 31 may be configured to receive the intrinsic reliability metrics from the intrinsic reliability metrics generation unit 233, the data processing unit 23 being configured to generate the intrinsic reliability metrics online during each iteration during the decoding process; for example in response to an intrinsic reliability metrics generation request delivered by the variable node processing unit 31 for the computation of the auxiliary components of the first or the second auxiliary messages. The computation of the intrinsic reliability metrics online, each time an intrinsic reliability metrics is required for the variable node processing unit update, enables avoiding the memorization of all the intrinsic reliability metrics, resulting advantageously in significant memory and area savings, especially when considering high order Galois Fields.

In some embodiments, the variable node processing unit 31 may be configured to load at each iteration the intrinsic reliability metrics from the storage unit 21, the data processing unit 23 being configured to previously compute at least a part of the intrinsic reliability metrics offline and to store the computed part of the intrinsic reliability metrics in the storage unit 21.

Figure 4:
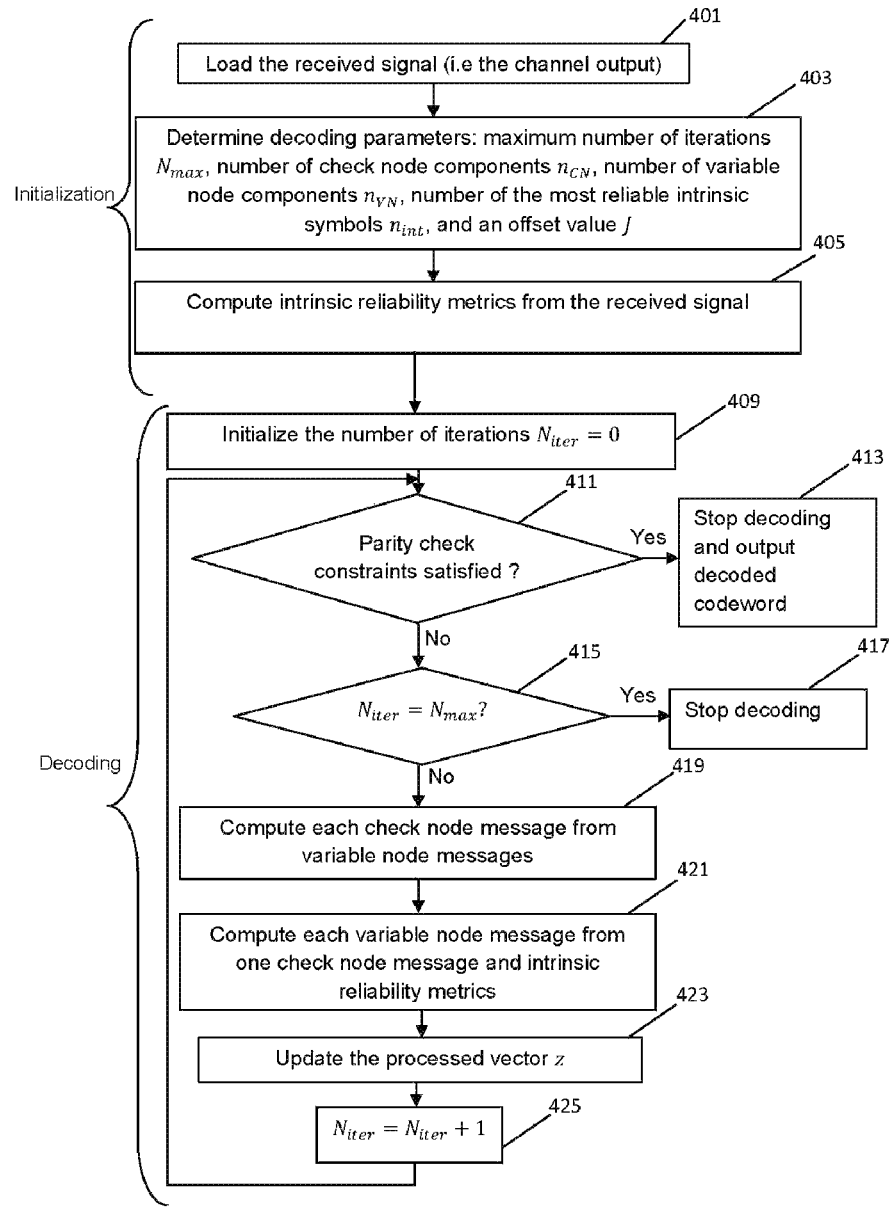
FIG. 4 is a flowchart illustrating a method of decoding a signal encoded using a non-binary error correcting code, according to some embodiments in which the EMS decoding algorithm is used.

FIG. 4 is a flowchart illustrating a method of decoding a signal received over a communication channel, the signal being encoded using a non-binary error correcting code $C$ (n,K) constructed over the Galois field GF(q) and being decoded according to some embodiments of the disclosure in which the EMS algorithm using a flooding scheduling is applied for example.

Accordingly, the decoding process may comprise two phases: an initialization phase and a decoding phase.

At step 401, the received signal y may be received. The received signal can be written as a function of a transmitted codeword according to:

$$y = c + w \qquad (9)$$

In equation (9), w designates a vector of length n modeling the noise altering the communication channel.

At step 403, one or more decoding parameters may be determined. The decoding parameters may comprise a maximum number of iterations $N_{max}$ of the EMS iterative decoding process, a number of check node components $n_{CN}$, a number of variable node components $n_{VN}$, a predefined number of $n_{int}$ of the most reliable symbols, and an offset value J.

The maximum number of iterations $N_{max}$ may have an impact on the decoding performance and complexity. A small number of iterations may be preferred if the available computational and memory resources are limited or if the decoding delay is limited enabling a throughput enhancement. On the opposite, a large number of iterations enabling for better decoding performance may be for example preferred in the presence of a high noise level, i.e. at low signal-to-noise ratio. The maximum number of iterations may be therefore, in some embodiments, adjusted as a function of the noise level and/or of other parameters of the system operability such as the size of the decoder memory units/buffers.

In some embodiments applied to the EMS algorithm, the number of check node components and the number of variable node components may be set at a number strictly lower than the order of the Galois field, i.e. $n_{CN} < q$ and $n_{VN} < q$.

In an embodiment, the number of variable node components $n_{VN}$ and the number of check node components $n_{CN}$ may be different, i.e. $n_{VN} \neq n_{CN}$.

In another embodiment, the number of variable node components $n_{VN}$ and the number of check node components $n_{CN}$ may be identical, i.e. $n_{VN} = n_{CN}$.

According to some embodiments, the number of check node components $n_{CN}$ may further depend on the non-binary error correcting code (e.g. the algebraic structure over which the code is constructed) and/or on the order of the decoding iteration of the iterative decoding process and/or on the signal-to-noise ratio and/or on the computational and storage capabilities of the decoder and/or on the maximum number of iterations of the decoding process.

According to some embodiments, the number $n_{int}$ of intrinsic reliability metrics may be determined depending on one or more parameters chosen in a group comprising a signal-to-noise ratio, the number of iterations of the decoding process, and the algebraic structure of the non-binary error correcting code.

According to some embodiments, the number $n_{int}$ of the most reliable intrinsic symbols or equivalently of the intrinsic reliability metrics associated with the most reliable symbols may be determined depending on the number of check node components $n_{CN}$, the number of the most reliable intrinsic symbols being strictly lower than the number of check node components $n_{int} < n_{CN}$.

According to some embodiments, the offset value may be determined according to a predefined decoding performance criterion.

According to some embodiments, the offset value may be determined depending on the number of iterations of the messages exchange, a different offset value being dynamically determined (i.e. updated) at each iteration of the decoding process.

At step 405, $n_{int}$ intrinsic reliability metrics $I^+(x_l)$, $l=0, \ldots, n_{int}-1$ associated with the most reliable intrinsic symbols $x_l$ that belong to the Galois field and $n_{CN}$ intrinsic reliability metrics $I^+(V_i^\oplus)$, $i=0, \ldots, n_{CN}-1$ associated with the symbols $V_i^\oplus$ comprised in the check node components $V_i$ may be computed from the received signal according to equation (3), the intrinsic reliability metrics to be used to initialize the variable node messages.

The computed intrinsic reliability metrics is used during the iterative decoding process as initial variable node messages to be delivered by the variable node processing units. Exchanging variable node messages and check node messages carrying such reliability metrics during a number of iterations enables processing a signal $z=(z_1, z_2, \ldots, z_n)$ for generating an estimate $\hat{u}$ to bring it closer to the MAP estimate $\hat{u}_{MAP}$. For z to be a codeword it should satisfy all the parity-check equations i.e. H. $z^t=0$. The decoded message z may be initialized as $z=(\beta_1, \beta_2, \ldots, \beta_n)$, using the most reliable symbols $\beta_i$.

Accordingly, at step 409, the number of iterations may be initialized, i.e. set to zero, $N_{iter}=0$.

Step 411 may be performed to check if the parity-check constraints (i.e the parity-check equation) are satisfied.

If it is determined at step 411 that the processed signal z satisfies the parity-check equations and meets H. $z^t=0$, then the decoding process may be stopped and the decoded codeword $\hat{u}=z$ may be delivered at step 413.

If it is determined at step 411 that the parity-check constraints are not met, step 415 may be performed to check if the maximum number of iterations $N_{max}$ is reached, i.e. to check if $N_{iter}=N_{max}$. If it is determined that the number of performed iterations reached the maximum number of iterations, the decoding process may be stopped and a decoding failure may be declared at step 417. If it is determined that the maximum number of iterations is not reached yet, steps 419 to 425 may be performed to run one iteration of the exchange of check node messages and variable node messages, a check node message comprising $n_{CN}$ check node components and a variable node message comprising $n_{VN}$ variable node components.

In some embodiments, the number of check node components and the number of variable node components may be different.

At step 419, the check node messages may be computed from the variable node messages. The check node components comprised in each check node message may be sorted according to a given order (increasing or decreasing) of the reliability metrics.

At step 421, the variable node messages may be computed, each variable node message being computed from one check node message and the $n_{int}+n_{VN}$ intrinsic reliability metrics. The variable node components comprised in each variable node message may be sorted according to a given order (increasing or decreasing) of the reliability metrics.

At step 423, the processed signal z may be updated according to the reliability metrics comprised in the variable node components.

At step 425, the number of iterations of the messages exchange may be incremented according to $N_{iter}=N_{iter}+1$.

There is also provided a method of determining one variable node message from one check node message and $n_{int}+n_{VN}$ intrinsic reliability metrics derived from the received signal. The provided method corresponds to the computation of one variable node message performed at step 421.

Figure 5:
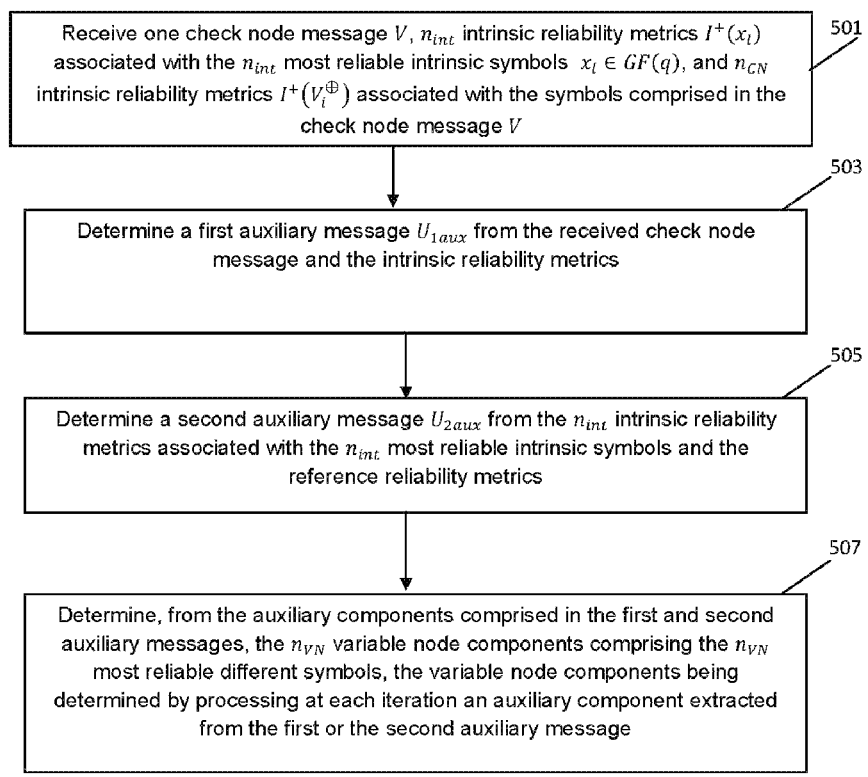
FIG. 5 is a flowchart illustrating a method of computing a variable node message, according to some embodiments of the invention in which the variable node message is determined iteratively from one check node message and intrinsic reliability metrics.

FIG. 5 is a flowchart depicting a method of computing the variable node components $U_t=(U_t^\oplus, U_t^+)$ for $t=0, \ldots, n_{VN}-1$ of one variable node message U, according to some embodiments of the disclosure in which the variable node components are determined iteratively, one variable node component being determined at each iteration, from one check node message V and $n_{int}+n_{VN}$ intrinsic reliability metrics.

At step 501, one check node message V comprising $n_{CN}$ check node components $V_i=(V_i^\oplus, V_i^+)$ for $i=0, \ldots, n_{CN}-1$, $n_{int}$ intrinsic reliability metrics $I^+(x_l)$ associated with the $n_{int}$ most reliable intrinsic symbols $x_l \in GF(q)$, and $n_{CN}$ intrinsic reliability metrics $I^+(V_i^\oplus)$ associated with the symbols comprised in the check node message V may be received.

According to some embodiments, the $n_{CN}$ check node components may be received in serial or sequentially such that a check node component is received at each iteration (for example at each clock cycle).

The variable node components may be determined from $n_{int}+n_{VN}$ auxiliary components denoted by $U_{aux,r}=(U_{aux,r}^\oplus, U_{aux,r}^+)$ derived from the check node message V and the intrinsic reliability metrics $I^+(x_l)$ and $I^+(V_i^\oplus)$, one or more auxiliary components being processed at each iteration. An auxiliary component $U_{aux,r}=(U_{aux,r}^\oplus, U_{aux,r}^+)$ may comprise an auxiliary symbol $U_{aux,r}^\oplus$ and an auxiliary reliability metrics $U_{aux,r}^+$ associated with the symbol $U_{aux,r}^\oplus$.

At step 503, a first auxiliary message $U_{1aux}$ may be determined from the check node message V and the intrinsic reliability metrics $I^+(V_i^\oplus)$ associated with the symbols comprised in the check node message V.

In some embodiments, the first auxiliary message $U_{1aux}$ may comprise $n_{CN}$ auxiliary components $U_{1aux,i}=(U_{1aux,i}^\oplus, U_{1aux,i}^+)$ with $i=0, \ldots, n_{CN}-1$, an auxiliary symbol $U_{1aux,i}^\oplus$ being determined from a symbol comprised in the check node message according to equation (5) and the auxiliary reliability metrics $U_{1aux,i}^+$ associated with the auxiliary symbol $U_{1aux,i}^\oplus$ being determined by applying an addition operation to the intrinsic reliability metrics $I^+(V_i^\oplus)$ associated with the auxiliary symbol $V_i^\oplus$ and a reliability metrics $V_i^+$ comprised in a check node component $V_i=(V_i^\oplus, V_i^+)$ in association with a symbol $V_i^+$ equal to the auxiliary symbol $U_{1aux,i}^\oplus=V_i^\oplus$ according to equation (6).

At step 505, a second auxiliary message $U_{2aux}$ may be determined from the intrinsic reliability metrics $I^+(x_l)$ associated with a predefined number $n_{int}$ of the most reliable $n_{int}$ symbols $x_l \in GF(q)$.

In some embodiments, the second auxiliary message $U_{2aux}$ may comprise $n_{int}$ auxiliary components $U_{2aux,l}=$ $(U_{2aux,l}^{\oplus}, U_{2aux,l}^{+})$ for $l=0, \ldots, n_{int}-1$, an auxiliary symbol $U_{2aux,l}^{\oplus}$ comprised in the second auxiliary message $U_{2aux}$ being determined from the most reliable intrinsic symbols $x_l$ associated with the highest or lowest intrinsic reliability metrics $I^{+}(x_l)$ for $l=0, \ldots, n_{int}-1$ according to equation (7), and the reliability metrics $U_{2aux,l}^{+}$ associated with an auxiliary symbol $U_{2aux,l}^{\oplus}$ comprised in the second auxiliary message $U_{2aux}$ being determined by applying an addition operation to the reference reliability metrics and to the intrinsic reliability metrics $I^{+}(x_l)$ associated with the intrinsic symbol $x_l$ according to equation (8).

According to some embodiments in which at least a part of the intrinsic reliability metrics $I^{+}(x_l)$ for $x_l \in GF(q)$ has been previously computed and stored (for example computed offline during the initialization phase illustrated in FIG. 4), the intrinsic reliability metrics may be loaded from storage units, an intrinsic reliability metrics being loaded each time it is required for the computation of an auxiliary component of the first or the second auxiliary messages.

In other embodiments, the intrinsic reliability metrics may be computed online (i.e. during the decoding phase) in response to an intrinsic reliability metrics request delivered each time an intrinsic reliability metrics is required for the computation of an auxiliary component of the first or the second auxiliary messages.

In other embodiments, at least a part of the intrinsic reliability metrics may be computed offline and at least a part of the intrinsic reliability metrics may be computed online in response to a delivered intrinsic reliability metrics request.

The auxiliary components regrouping the first and second auxiliary messages may be not sorted (due to the computations involving the intrinsic reliability metrics) and may comprise redundant symbols. Sorting and redundancy elimination operations are thus required in order to generate, from the auxiliary components, the variable node components comprising the most reliable different symbols.

At step 507, $n_{VN}$ variable node components may be determined iteratively from the auxiliary components comprised in the first and the second auxiliary messages, the variable node components being determined by processing at each iteration at least an auxiliary component extracted from the first or the second auxiliary message, the processing comprising iteratively sorting the auxiliary components according to a given order of the auxiliary reliability metrics and keeping a predefined number $n_{VN}$ of auxiliary components comprising the auxiliary symbols that are all different from one another and the most reliable.

Figure 6:
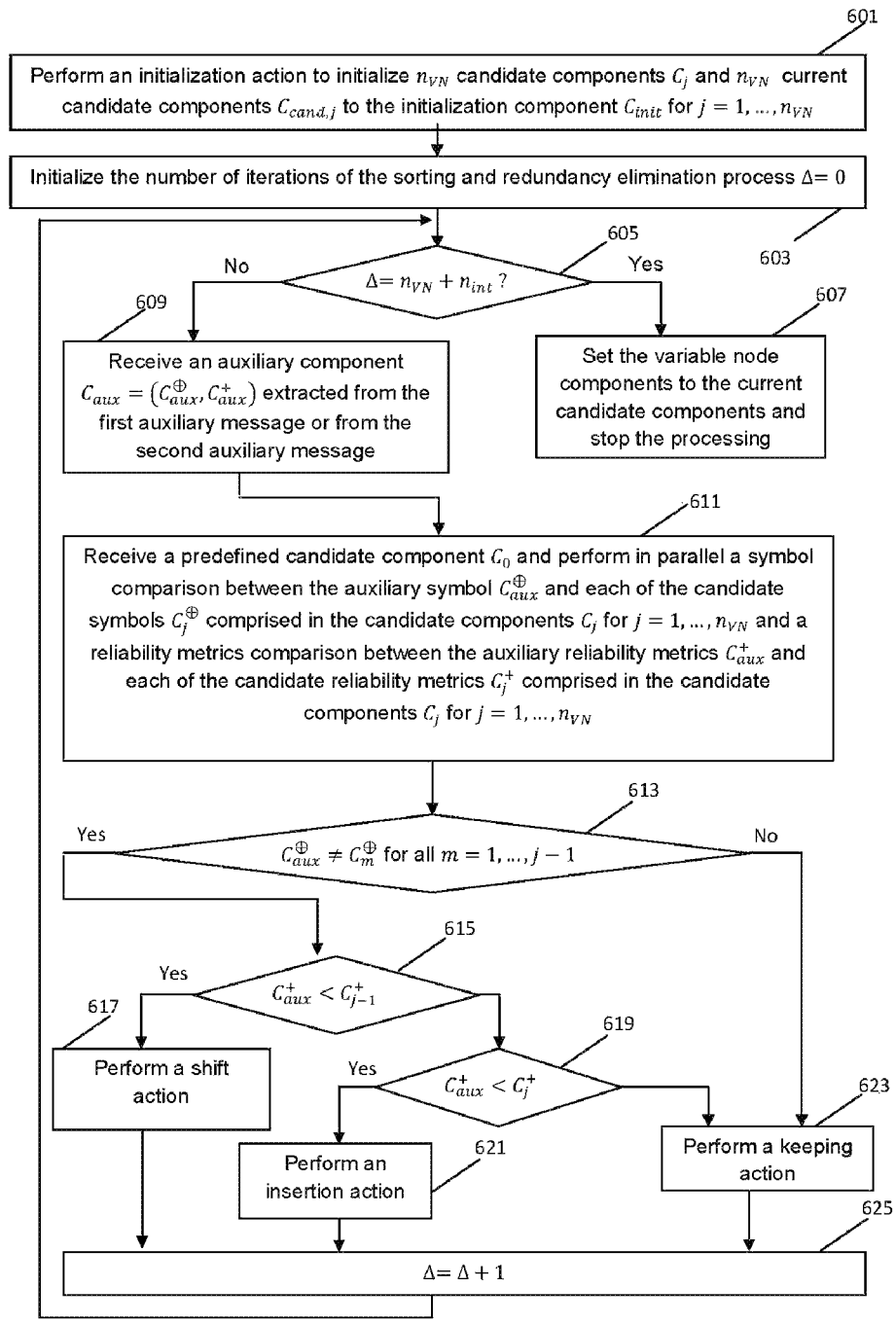
FIG. 6 is a flowchart illustrating a method of determining sorted variable node components comprising different symbols, according to some embodiments of the invention in which iterative sorting and redundancy elimination are performed.

FIG. 6 is a flowchart illustrating a sorting and redundancy elimination method used at step 507 for determining $n_{VN}$ variable node components from the auxiliary components comprised in the first and second auxiliary messages, according to some embodiments of the disclosure in which sorting and redundancy elimination are performed simultaneously during a predefined number of iterations.

In embodiments in which an iteration is performed during a clock cycle, the sorting and redundancy elimination requires a latency of $\Delta = n_{CN} + n_{int}$ lock cycles and reduces the memorization required for the computation of the variable node components, resulting thus in more efficient architectures for variable node processing in terms of computing load, latency, and storage.

Further, in pipelined embodiments in which the check node components are received online serially (i.e. a check node component is received at each iteration of the iterations of the sorting and redundancy elimination process), the latency of the variable node message generation in terms of the number of clock cycles can be advantageously reduced to $\Delta = 1 + n_{int}$.

According to some embodiments, the sorting and redundancy elimination method may be based on a determination, at each iteration, of $n_{VN}$ current candidate components $C_{cand,j} = (C_{cand,j}^{\oplus}, C_{cand,j}^{+})$ for $j=1, \ldots, n_{VN}$ depending on:
comparisons performed between the auxiliary symbol $C_{aux}^{\oplus}$ comprised in at least an auxiliary component $C_{aux}$ extracted from the first or the second auxiliary messages and the candidate symbols $C_j^{\oplus}$ comprised in at least one of the candidate components $C_j$ determined at a previous iteration, and
comparisons performed between the auxiliary reliability metrics $C_{aux}^{+}$ comprised in at least an auxiliary component $C_{aux}$ extracted from the first or the second auxiliary message and the candidate reliability metrics $C_j^{+}$ comprised in at least one of the candidate components $C_j$ determined at a previous iteration.

Depending on the comparisons results, control actions may be decided at each iteration to determine current candidate components by updating the candidate components previously determined at the previous iteration. A control action may consist in an initialization action, a keeping action, an insertion action, or a shift action.

At step 601, an initialization action for the initialization of $n_{VN}$ candidate components $C_j$ for $j=1, \ldots, n_{VN}$ and $n_{VN}$ current candidate components $C_{cand,j}$ may be performed according to the initialization component $C_{init}$ such that the candidate symbol and the current candidate symbol are equal to the initialization symbol according to $C_j^{\oplus} = C_{cand,j}^{\oplus} = C_{init}^{\oplus}$ and that the reliability metrics $C_j^{+}$ associated with the candidate symbol $C_j^{\oplus}$ and the reliability metrics associated with the current candidate symbol $C_{cand,j}^{\oplus}$ are equal to the initialization reliability metrics according to $C_j^{+} = C_{cand,j}^{+} = C_{init}^{+}$.

At step 603, an initialization of the number of iterations of the sorting and redundancy elimination process may be performed according to $\Delta = 0$. In embodiments in which an iteration is performed during a clock cycle, the number of iterations of the sorting and redundancy elimination process may correspond to the sorting and redundancy elimination processing time period i.e. the latency in terms of the number of clock cycles.

At step 605, the processing of the totality $n_{CN} + n_{int}$ of the auxiliary components comprised in the first and auxiliary components may be controlled by checking if the number of iterations of the sorting and redundancy elimination process $\Delta$ reached $n_{CN} + n_{int}$.

If it is determined at step 605 that $\Delta = n_{CN} + n_{int}$, this means that all the auxiliary components comprised in the first and the second auxiliary messages have been processed. Thus, the sorting and redundancy elimination operations may be stopped and the $n_{VN}$ variable node components may be set to the current candidate components (i.e. the last updated candidate components) at step 607.

If it is determined at step 605 that $\Delta \neq n_{CN} + n_{int}$, more precisely that $\Delta < n_{CN} + n_{int}$, there is at least one auxiliary component comprised in the first auxiliary message or in the second auxiliary message that has not been processed yet during the sorting and redundancy elimination processing. Accordingly, at least an auxiliary component $C_{aux} = (C_{aux}^{\oplus}, C_{aux}^{+})$ (an auxiliary component that was not yet processed) extracted from the first or the second auxiliary message may be received at step 609. Steps 611 to 623 may be performed to determine $n_{VN}$ current candidate components $C_{cand,j}$ for $j=1, \ldots, n_{VN}$.

The following description will be made with reference to processing an auxiliary component at each iteration. The skilled person will readily understand that the various embodiments of the disclosure apply to the processing of two or more auxiliary components at each of one or more iterations.

At step 611, a predefined candidate component $C_0$ may be received and a symbol comparison between the auxiliary symbol $C_{aux}^{\oplus}$ comprised in the received auxiliary component $C_{aux}$ extracted from the first or the second auxiliary components and each of the candidate symbols $C_j^{\oplus}$ comprised in the candidate components $C_j$ for $j=1, \ldots, n_N$, and a reliability metrics comparison between the auxiliary reliability metrics $C_a + x$ and each of the candidate reliability metrics $C_j^+$ comprised in the candidate components $C_j$ for $j=1, \ldots, n_{VN}$ may be performed.

Control actions may be performed at steps 617, 621, and 623 to determine, in parallel, $n_{VN}$ current candidate components $C_{cand,j}$ for $j=1, \ldots, n_{VN}$ depending on the results of the symbol and reliability metrics comparisons. More specifically:

- an insertion action may be performed at step 621 to set a current candidate component $C_{cand,j}$ equal to the auxiliary component $C_{aux}$ if it is determined at step 613 that the auxiliary symbol $C_{aux}^{\oplus}$ comprised in the auxiliary component $C_{aux}$ is not redundant with none of the symbols $C_m^{\oplus}$ comprised in the candidate components $C_m$ for $m=1, \ldots, j-1$ determined at the previous iteration (i.e. if it is determined at step 613 that $C_{aux}^{\oplus} \neq C_m^{\oplus}$ for $m=1, \ldots, j-1$) and it is determined at step 615 that the auxiliary symbol $C_{aux}^{\oplus}$ comprised in the auxiliary component $C_{aux}$ is more reliable than the symbol $C_{j-1}^{\oplus}$ comprised in the candidate component $C_{j-1}$ determined at the previous iteration and that it is determined at step 619 that the auxiliary symbol $C_{aux}^{\oplus}$ is less reliable than the symbol $C_j^{\oplus}$ comprised in the candidate component $C_j$ determined at the previous iteration (i.e. if it is determined at step 615 of the current iteration that $C_{aux}^+ < C_{j-1}^+$ and it is determined at step 619 that $C_{aux}^+ < C_j^+$). In the comparison involving the index $j=1$, the predefined candidate component $C_0$ is considered. According to the insertion action, a current candidate component $C_{cand,j}$ may be determined by replacing the candidate component previously selected during the previous iteration by the auxiliary component such that $C_{cand,j}^{\oplus} = C_{aux}^{\oplus}$ and $C_{cand,j}^+ = C_{aux}^+$;
- a shift action may be performed at step 615 to set a current candidate component $C_{cand,j}$ equal to the candidate component $C_{j-1}$ determined at the previous iteration if it is determined at step 613 that the auxiliary symbol $C_{aux}^{\oplus}$ comprised in the auxiliary component $C_{aux}$ is not redundant with none of the symbols $C_m^+$ comprised in the candidate components $C_m$ for $m=1, \ldots, j-1$ determined at the previous iteration (i.e. if it is determined at step 613 that $C_{aux}^{\oplus} \neq C_m^{\oplus}$ for $m=1, \ldots, j-1$) and it is determined at step 615 that the auxiliary symbol $C_{aux}^{\oplus}$ comprised in the auxiliary component $C_{aux}$ is more reliable than the symbol $C_{j-1}^{\oplus}$ comprised in the candidate component $C_{j-1}$ determined at the previous iteration (i.e. if it is determined at step 615 of the current iteration that $C_{aux}^+ < C_{j-1}^+$). According to the shift action, the current candidate component $C_{cand,j}$ may be determined such that $C_{cand,j}^{\oplus} = C_{j-1}^{\oplus}$, $C_{cand,j}^+ = C_{j-1}^+$, and
- a keeping action may be performed at step 623 to determine a current candidate component by setting the current candidate component $C_{cand,j}$ equal to the candidate component $C_j$ determined at the previous iteration:
  if it is determined at step 613 that the auxiliary symbol $C_{aux}^{\oplus}$ comprised in the auxiliary component $C_{aux}$ is not redundant with none of the candidate components $C_m$ for $m=1, \ldots, j-1$ determined at the previous iteration (i.e. if, at each step 611 of each of the previous iterations of indices m varying between 1 and $j-1$, it is determined that $C_{aux}^{\oplus} \neq C_m^{\oplus}$), and it is determined at step 619 that the auxiliary symbol $C_{aux}^{\oplus}$ comprised in the auxiliary component $C_{aux}$ is less reliable than the symbol $C_j^{\oplus}$ comprised in the candidate component $C_j$ determined at the previous iteration (i.e. if, for an increasing order of the reliability metrics, it is determined at step 615 of the previous iteration that $C_{aux}^+ \geq C_j^+$); or
  if it is determined at step 613 that the auxiliary symbol $C_{aux}^{\oplus}$ comprised in the auxiliary component $C_{aux}$ is redundant with at least one of the symbols $C_m^{\oplus}$ comprised in one of the candidate components $C_m$ determined at a previous iteration, for m varying between 1 and $j-1$ (i.e. if it is determined at step 613 of at least one previous iteration that $C_{aux}^{\oplus} = C_m^{\oplus}$ for at least one index m taking value between 1 and $j-1$). According to the keeping action, the current candidate component $C_{cand,j}$ may be set equal to the candidate component previously selected, during the previous iteration, such that $C_{cand,j}^{\oplus} = C_j^{\oplus}$ and $C_{cand,j}^+ = C_j^+$.

Step 625 may be performed to increment the number of the performed iterations according to $\Delta = \Delta + 1$.

The methods and devices described herein may be implemented by various means. For example, these techniques may be implemented in hardware, software, or a combination thereof. For a hardware implementation, the processing elements of an iterative decoder 123 may be implemented for instance according to a hardware-only configuration (as example, in one or more FPGA, ASIC or VLSI integrated circuits with the corresponding memory) or according to a configuration using both VLSI and DSP.

While embodiments of the disclosure have been illustrated by a description of various examples, and while these embodiments have been described in considerable detail, it is not the intent of the applicant to restrict or in any way limit the scope of the appended claims to such details.

In particular, while the description of some embodiments of the disclosure has been performed with reference to a particular implementation of the EMS algorithm, it should be noted that the disclosure may be also applied to other iterative decoding algorithms such as the min-max algorithm.

Furthermore, while some embodiments of the disclosure have been described with reference to error correcting codes constructed over Galois Fields, the skilled person will readily understand that the proposed embodiments may be also applied to any non-binary LDPC codes and any non-binary graph error correcting code constructed over non-commutative groups such as polynomial codes (e.g. cyclic codes).

Further, even if the disclosure has some advantages in an application to communication systems, it should be noted that the disclosure is not limited to such communication devices and may be integrated in numerous devices such as data storage devices.

The methods described herein can be implemented by computer program instructions supplied to the processor of any type of computer to produce a machine with a processor that executes the instructions to implement the functions/ acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A variable node processing unit implemented in a non-binary error correcting code decoder, the decoder being configured to determine and output an estimate of a codeword from a sequence received from a transmitter using messages exchanged between one or more variable node processing units and one or more check node processing units implemented in the decoder, wherein the variable node processing unit is configured to receive one check node message from a check node processing unit comprised in said decoder and intrinsic reliability metrics, and to generate one variable node message from auxiliary components extracted from a first auxiliary message or a second auxiliary message, said first auxiliary message being derived from said one check node message and intrinsic reliability metrics, said second auxiliary message being derived from at least some of said intrinsic reliability metrics, the intrinsic reliability metrics being derived from a received signal, an auxiliary component comprising an auxiliary symbol and an auxiliary reliability metrics associated with said auxiliary symbol, wherein the variable node processing unit comprises:
 a sorting and redundancy elimination unit configured to process iteratively the auxiliary components, one auxiliary component being processed at each iteration, and to determine components of the variable node message by iteratively sorting the auxiliary components according to a given order of the auxiliary reliability metrics and keeping a predefined number of auxiliary components comprising the auxiliary symbols that are the most reliable and all different from one another.

2. The variable node processing unit of claim 1, wherein the variable node processing unit comprises a calculation unit configured to determine said first auxiliary message from the check node message and the intrinsic reliability metrics and to determine said second auxiliary message from the intrinsic reliability metrics associated with a predefined number of the most reliable intrinsic symbols and a reference reliability metrics.

3. The variable node processing unit of claim 2, wherein the check node message comprises check node components, each check node component comprising a symbol and a reliability metrics associated with said symbol, the calculation unit being configured to:
 determine the auxiliary symbols comprised in the first auxiliary message from the symbols comprised in the check node message, an auxiliary symbol being selected from the symbols comprised in the check node components, and
 to determine each auxiliary reliability metrics associated with an auxiliary symbol comprised in the first auxiliary message by applying an addition operation over a predefined algebraic structure, said addition operation being applied to the intrinsic reliability metrics associated with said auxiliary symbol and a reliability metrics comprised in a check node component in association with the selected auxiliary symbol.

4. The variable node processing unit of claim 3, wherein the predefined algebraic structure is chosen in a group comprising the field of real numbers, the field of integer numbers, and the field of natural numbers.

5. The variable node processing unit of claim 2, further configured to receive a reference reliability metrics determined in the non-binary error correcting code decoder from an offset value and the check node component comprising the least reliable symbol, the calculation unit being configured to:
 determine the auxiliary symbols comprised in the second auxiliary message from a predefined number of the most reliable intrinsic symbols associated with the lowest or the highest intrinsic reliability metrics, an auxiliary symbol being equal to an intrinsic symbol among said most reliable intrinsic symbols, and
 to determine the auxiliary reliability metrics associated with an auxiliary symbol comprised in the second auxiliary message by applying an addition operation over a predefined algebraic structure, the addition operation being applied to said reference reliability metrics and to the intrinsic reliability metrics associated with the intrinsic symbol equal to said auxiliary symbol.

6. The variable node processing unit of claim 5, wherein the offset value is determined in the non-binary error correcting code decoder according to a predefined decoding performance criterion.

7. The variable node processing unit of claim 5, wherein the variable node processing unit is configured to exchange during a number of iterations a variable node message and a check node message with at least one check node processing unit, the offset value being determined in the non-binary error correcting code decoder depending on said number of iterations, a different offset value being dynamically determined at each of said iterations.

8. The variable node processing unit of claim 1, wherein the sorting and redundancy elimination unit comprises:
 a plurality of multiplexers;
 a plurality of reliability metrics comparators, and
 a plurality of symbol comparators;
each multiplexer being associated with a reliability metrics comparator, and a symbol comparator, each multiplexer being configured to determine at each iteration a current candidate component depending on the comparisons performed by the plurality of symbol comparators and the plurality of reliability metrics comparators, the sorting and redundancy elimination unit being configured to generate, after processing all the auxiliary components comprised in the first and the second auxiliary messages, the variable node components from the candidate components comprising the symbols that are the most reliable and all different from one another.

9. The variable node processing unit of claim 8, wherein a candidate component comprises a candidate symbol and a candidate reliability metrics associated with said candidate symbol, each multiplexer being configured to receive, at each iteration, at least an auxiliary component extracted from the first or the second auxiliary message and a predefined initialization component, the predefined initialization component comprising an initialization symbol and an initialization reliability metrics associated with said initialization symbol, each multiplexer being configured to determine at each iteration a current candidate component by selecting a component among said at least auxiliary component, said predefined initialization component, and a component corresponding to a candidate component determined by said multiplexer at a previous iteration, and:

the reliability metrics comparator associated with each multiplexer being configured to perform a comparison between the auxiliary reliability metrics comprised in said at least an auxiliary component and the candidate reliability metrics comprised in the candidate component determined by each multiplexer at the previous iteration, and the symbol comparator associated with each multiplexer being configured to check redundancy of symbols by performing a comparison between the auxiliary symbol comprised in said at least an auxiliary component and the candidate symbol comprised in the candidate component determined by said each multiplexer at the previous iteration.

10. The variable node processing unit of claim 9, wherein each of the plurality of multiplexer is configured to perform an initialization action at a first iteration by setting the current candidate component equal to said initialization component.

11. The variable node processing unit of claim 8, wherein at each iteration, each multiplexer is configured to:

perform a keeping action by setting the current candidate component equal to the candidate component determined at the previous iteration:

if it is determined that the auxiliary symbol comprised in the at least an auxiliary component is not redundant with none of the candidate components determined at the previous iteration and it is determined that the auxiliary symbol comprised in the at least auxiliary component is less reliable than the symbol comprised in the candidate component determined at the previous iteration by the multiplexer; or if it is determined that the auxiliary symbol comprised in the at least an auxiliary component is redundant with at least one of the symbols comprised in one of the candidate components determined by at least one of the multiplexers at a previous iteration, for m varying between 1 and j−1;

perform an insertion action by setting the current candidate component equal to the auxiliary component if it is determined that the auxiliary symbol comprised in the auxiliary component is not redundant with none of the symbols comprised in the candidate components determined at the previous iteration by the multiplexers at a previous iteration, for m varying between 1 and j−1 and it is determined that the auxiliary symbol comprised in the auxiliary component is more reliable than the symbol comprised in the candidate component determined by the multiplexer at the previous iteration and that the auxiliary symbol is less reliable than the symbol comprised in the candidate component determined by the multiplexer at the previous iteration;

perform a shift action by setting the current candidate component equal to the candidate component determined by the multiplexer at a previous iteration if it is determined that the auxiliary symbol comprised in the auxiliary component is not redundant with none of the symbols comprised in the candidate components determined at the previous iteration by the multiplexers for m=1, . . . , j−1 and it is determined that the auxiliary symbol comprised in the auxiliary component is more reliable than the symbol comprised in the candidate component determined by the multiplexer at the previous iteration and that the auxiliary symbol is more reliable than the symbol comprised in the candidate component determined by the multiplexer at the previous iteration.

12. The variable node processing unit of claim 1, further configured to receive from a data processing unit in the non-binary error correcting code decoder the intrinsic reliability metrics online in response to an intrinsic reliability metrics generation request delivered by the variable node processing unit.

13. The variable node processing unit of claim 1, further configured to load, at each iteration, at least a part of the intrinsic reliability metrics from a storage unit.

14. A method, implemented in a variable node processing unit comprised in a non-binary error correcting code decoder, a non-binary error correcting code being used at the transmitter to encode said codeword, the decoder being configured to determine and output an estimate of a codeword from a sequence received from a transmitter using messages exchanged between one or more variable node processing units and one or more check node processing units implemented in the decoder, wherein the method comprises receiving one check node message from a check node processing unit comprised in said decoder and intrinsic reliability metrics and generating one variable node message from auxiliary components extracted from a first auxiliary message and a second auxiliary message, said first auxiliary message being derived from one check node message and intrinsic reliability metrics, said second auxiliary message being derived from at least some of said intrinsic reliability metrics, the intrinsic reliability metrics being derived from a received signal, an auxiliary component comprising an auxiliary symbol and an auxiliary reliability metrics associated with said auxiliary symbol, wherein the method comprises:

determining components of the variable node message by processing the auxiliary components iteratively, one auxiliary component being processed at each iteration, for sorting the auxiliary components according to a given order of the auxiliary reliability metrics and keeping a predefined number of auxiliary components comprising the auxiliary symbols that are the most reliable and all different from one another.

* * * * *